(12) United States Patent
Buot et al.

(10) Patent No.: US 12,696,780 B2
(45) Date of Patent: Jul. 28, 2026

(54) PACKAGE COMPRISING A SUBSTRATE WITH CAVITY AND AN INTEGRATED DEVICE WITH A STEP BACK SIDE

(71) Applicant: QUALCOMM Incorporated, San Diego, CA (US)

(72) Inventors: Joan Rey Villarba Buot, Escondido, CA (US); Aniket Patil, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 377 days.

(21) Appl. No.: 18/532,864

(22) Filed: Dec. 7, 2023

(65) Prior Publication Data

US 2025/0191989 A1 Jun. 12, 2025

(51) Int. Cl.
| | |
|---|---|
| *H10W 70/68* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |

(Continued)

(52) U.S. Cl.
CPC ........ *H10W 70/682* (2026.01); *H10W 70/611* (2026.01); *H10W 70/65* (2026.01); *H10W 70/685* (2026.01); *H10W 74/01* (2026.01); *H10W 74/117* (2026.01); *H10W 90/701* (2026.01); *H10W 74/15* (2026.01); *H10W 90/724* (2026.01); *H10W 90/732* (2026.01); *H10W 90/734* (2026.01)

(58) Field of Classification Search
CPC ....... H10D 62/117; H10P 72/70; H10P 72/74; H10P 72/7402; H10P 72/7404; H10P 72/7406; H10P 72/7448; H10P 72/745; H10W 40/70; H10W 40/778; H10W 70/099; H10W 70/611; H10W 70/614; H10W 70/616; H10W 70/635; H10W 70/65; H10W 70/68; H10W 70/682; H10W 70/685; H10W 70/686; H10W 70/687; H10W 74/01; H10W 74/10; H10W 74/117; H10W 74/15
See application file for complete search history.

(56) References Cited

U.S. PATENT DOCUMENTS

| | | |
|---|---|---|
| 2018/0315740 A1* | 11/2018 | Im .......................... H10W 90/00 |
| 2019/0206824 A1 | 7/2019 | Lu |
| 2019/0378795 A1 | 12/2019 | Lee et al. |

(Continued)

OTHER PUBLICATIONS

International Search Report and Written Opinion—PCT/US2024/057141—ISA/EPO—Feb. 24, 2025.

*Primary Examiner* — Cheung Lee
(74) *Attorney, Agent, or Firm* — Loza & Loza, LLP

(57) ABSTRACT

A package comprising a first substrate; an integrated device coupled to the first substrate, wherein the integrated device comprises a step back side; a second substrate comprising a cavity, wherein the integrated device is located at least partially in the cavity of the second substrate; and an encapsulation layer coupled to the first substrate and the second substrate. The encapsulation layer is located between the first substrate and the second substrate. The encapsulation layer is located at least partially in the cavity of the second substrate.

18 Claims, 22 Drawing Sheets

*CROSS SECTIONAL PROFILE VIEW*

(51) Int. Cl.
     H10W 90/00       (2026.01)
     *H10W 74/15*       (2026.01)

(56)          References Cited

U.S. PATENT DOCUMENTS

| 2022/0102236 | A1 | 3/2022 | Kim et al. |
| 2023/0230908 | A1 | 7/2023 | Buot et al. |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

1000

PROVIDE A WAFER + CARRIER / TAPE — 1005

THIN SUBSTRATE / DIE SUBSTRATE OF THE WAFER — 1010

REMOVE PORTIONS OF SUBSTRATE / DIE SUBSTRATE AND/OR FORM TRENCHES IN THE WAFER — 1015

DECOUPLE CARRIER / TAPE FROM THE WAFER — 1020

FORM / COUPLE PILLAR INTERCONNECTS TO THE WAFER — 1025

SINGULATE WAFER TO FORM INDIVIDUAL INTEGRATED DEVICE WITH STEP BACK SIDE — 1030

SECOND INTEGRATED DEVICE COUPLING
SOLDER INTERCONNECT COUPLING
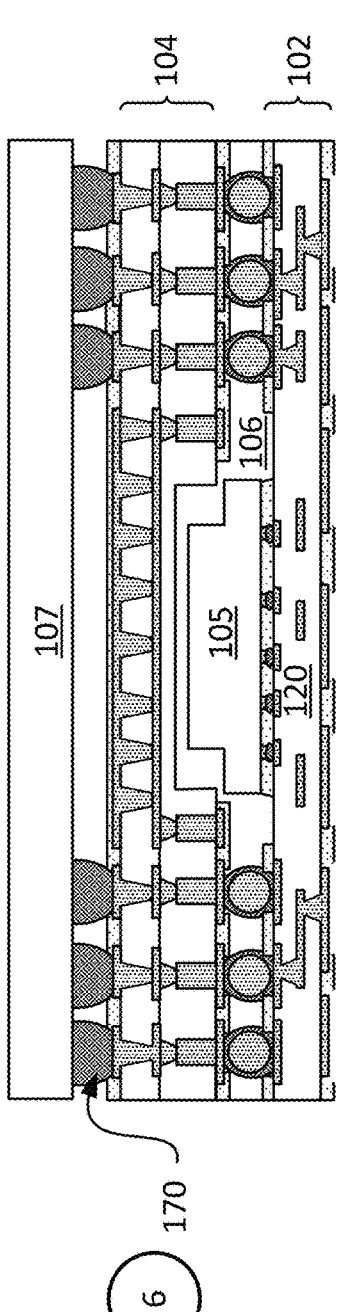
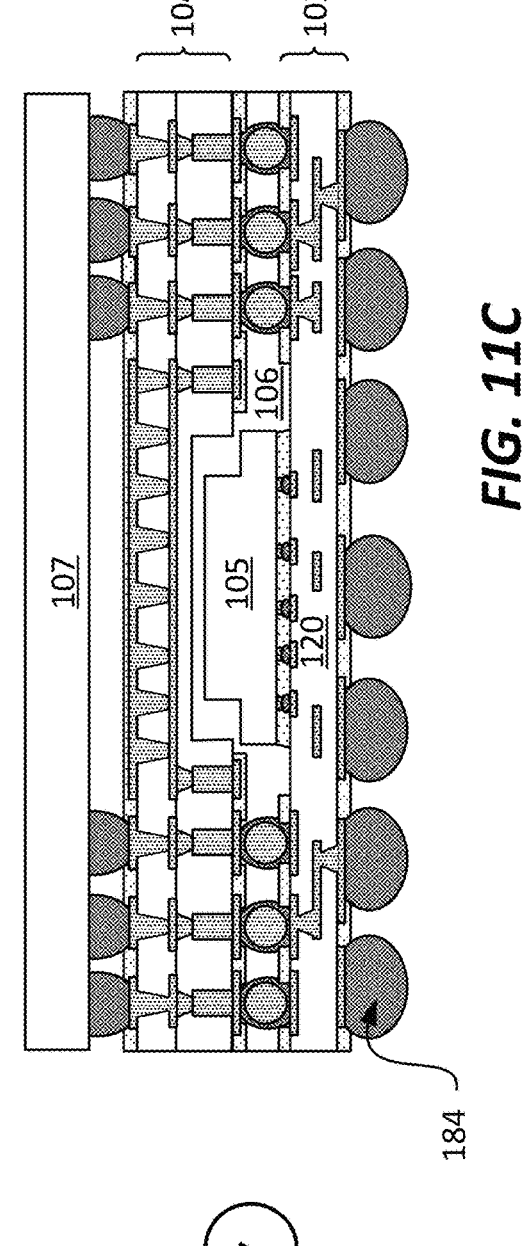
*FIG. 11C*

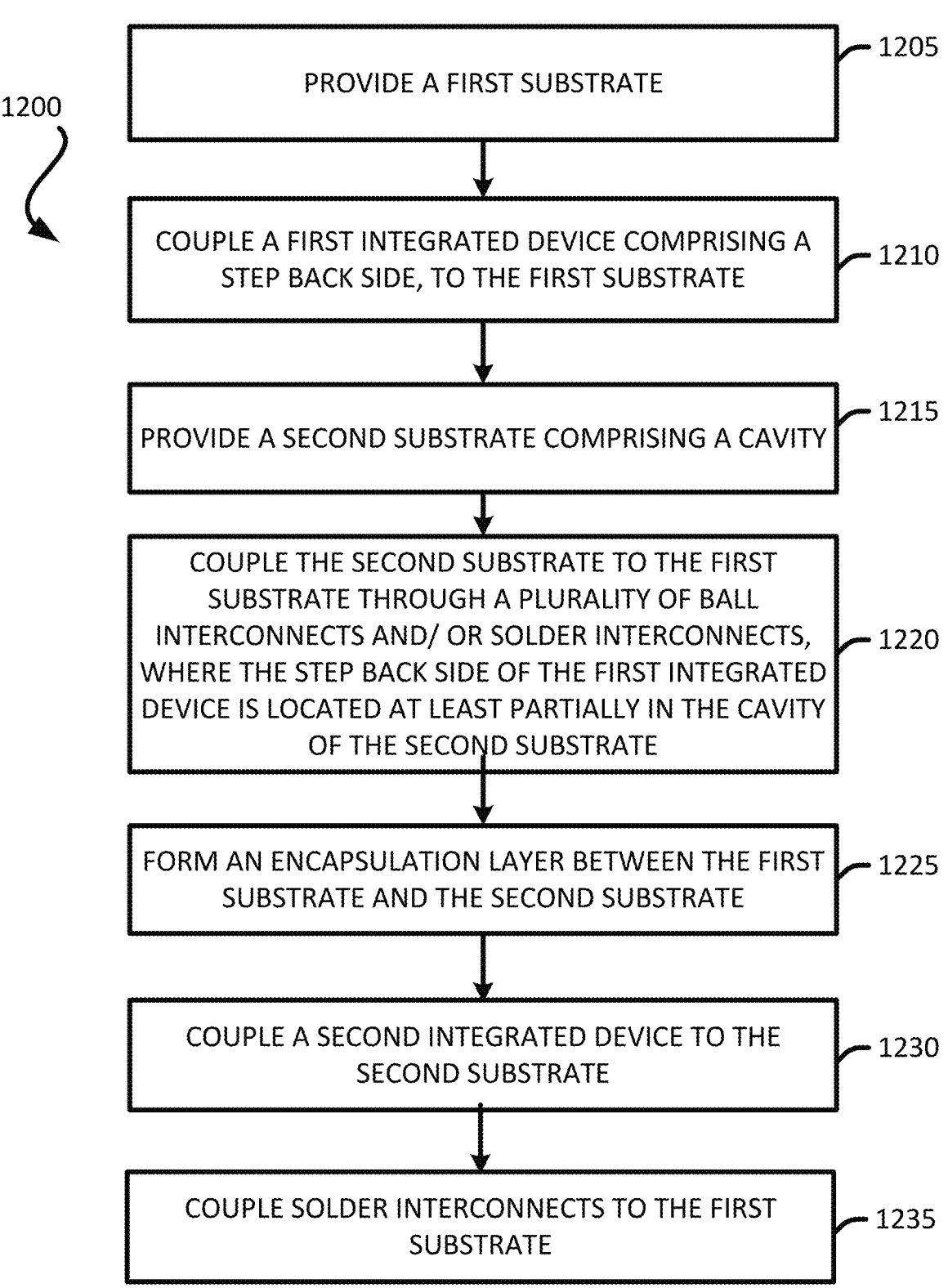

1200

PROVIDE A FIRST SUBSTRATE — 1205

COUPLE A FIRST INTEGRATED DEVICE COMPRISING A STEP BACK SIDE, TO THE FIRST SUBSTRATE — 1210

PROVIDE A SECOND SUBSTRATE COMPRISING A CAVITY — 1215

COUPLE THE SECOND SUBSTRATE TO THE FIRST SUBSTRATE THROUGH A PLURALITY OF BALL INTERCONNECTS AND/ OR SOLDER INTERCONNECTS, WHERE THE STEP BACK SIDE OF THE FIRST INTEGRATED DEVICE IS LOCATED AT LEAST PARTIALLY IN THE CAVITY OF THE SECOND SUBSTRATE — 1220

FORM AN ENCAPSULATION LAYER BETWEEN THE FIRST SUBSTRATE AND THE SECOND SUBSTRATE — 1225

COUPLE A SECOND INTEGRATED DEVICE TO THE SECOND SUBSTRATE — 1230

COUPLE SOLDER INTERCONNECTS TO THE FIRST SUBSTRATE — 1235

*FIG. 12*

CAVITY FORMATION

INTERCONNECT FORMATION 1410  1401  1420

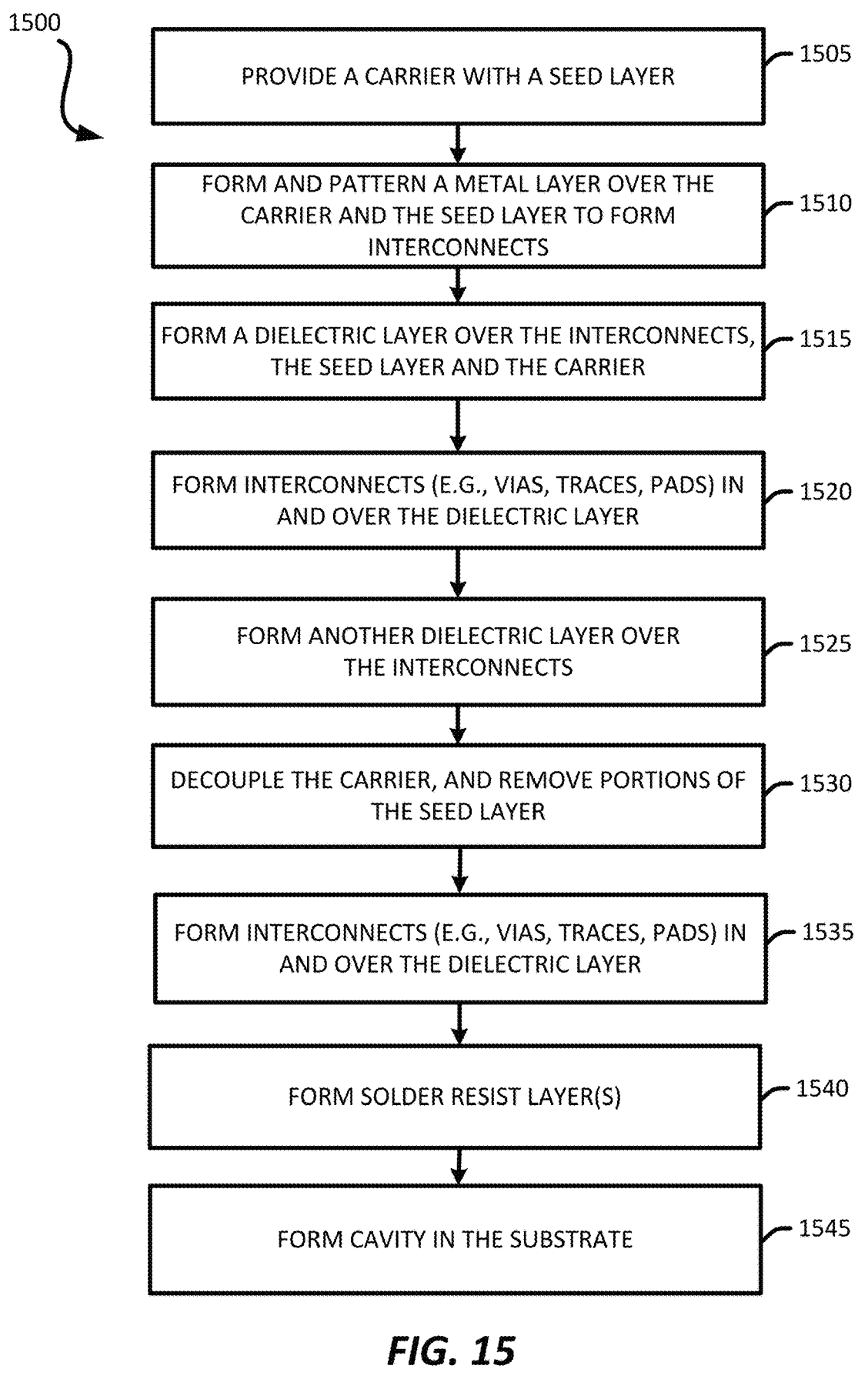

PROVIDE A CARRIER WITH A SEED LAYER ——1505

FORM AND PATTERN A METAL LAYER OVER THE CARRIER AND THE SEED LAYER TO FORM INTERCONNECTS ——1510

FORM A DIELECTRIC LAYER OVER THE INTERCONNECTS, THE SEED LAYER AND THE CARRIER ——1515

FORM INTERCONNECTS (E.G., VIAS, TRACES, PADS) IN AND OVER THE DIELECTRIC LAYER ——1520

FORM ANOTHER DIELECTRIC LAYER OVER THE INTERCONNECTS ——1525

DECOUPLE THE CARRIER, AND REMOVE PORTIONS OF THE SEED LAYER ——1530

FORM INTERCONNECTS (E.G., VIAS, TRACES, PADS) IN AND OVER THE DIELECTRIC LAYER ——1535

FORM SOLDER RESIST LAYER(S) ——1540

FORM CAVITY IN THE SUBSTRATE ——1545

*FIG. 15*

PACKAGE COMPRISING A SUBSTRATE WITH CAVITY AND AN INTEGRATED DEVICE WITH A STEP BACK SIDE

FIELD

Various features relate to packages with substrates and integrated devices.

BACKGROUND

A package may include a substrate and integrated devices. These components are coupled together to provide a package that may perform various electrical functions. There is an ongoing need to provide better performing packages. There is also an ongoing need to reduce the overall size of the packages.

SUMMARY

Various features relate to packages with substrates and integrated devices.

One example provides a package comprising a first substrate; an integrated device coupled to the first substrate, wherein the integrated device comprises a step back side; a second substrate comprising a cavity, wherein the integrated device is located at least partially in the cavity of the second substrate; and an encapsulation layer coupled to the first substrate and the second substrate. The encapsulation layer is located between the first substrate and the second substrate. The encapsulation layer is located at least partially in the cavity of the second substrate.

Another example provides a method for fabricating a package. The method provides a first substrate. The method couples an integrated device to the first substrate, wherein the integrated device comprises a step back side. The method provides a second substrate comprising a cavity, wherein the second substrate is provided such that the integrated device is located at least partially in the cavity of the second substrate. The method forms an encapsulation layer that coupled to the first substrate and the second substrate. The encapsulation layer is located between the first substrate and the second substrate. The encapsulation layer is located at least partially in the cavity of the second substrate.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 11A-11C illustrate an exemplary sequence for fabricating a package that includes a substrate and an integrated device with a step back side.

FIG. 12 illustrates an exemplary flow chart of a method for fabricating a package that includes a substrate and an integrated device with a step back side.

FIGS. 14A-14D illustrate an exemplary sequence for fabricating a substrate comprising a cavity.

FIG. 15 illustrates an exemplary flow chart of a method for fabricating a substrate comprising a cavity.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a first substrate; an integrated device coupled to the first substrate, wherein the integrated device comprises a step back side; a second substrate comprising a cavity, wherein the integrated device is located at least partially in the cavity of the second substrate; and an encapsulation layer coupled to the first substrate and the second substrate. The encapsulation layer is located between the first substrate and the second substrate. The encapsulation layer is located at least partially in the cavity of the second substrate. As will be further described below, the use of the step back side of the integrated device, helps reduce the size of the cavity in the second substrate, which helps provides more space for interconnects in the second substrate, that can be used for additional routing. This in turn, may help provide improved package performance, such as improved thermal performance, while keeping the package compact, small and/or thin.

Figure 1:
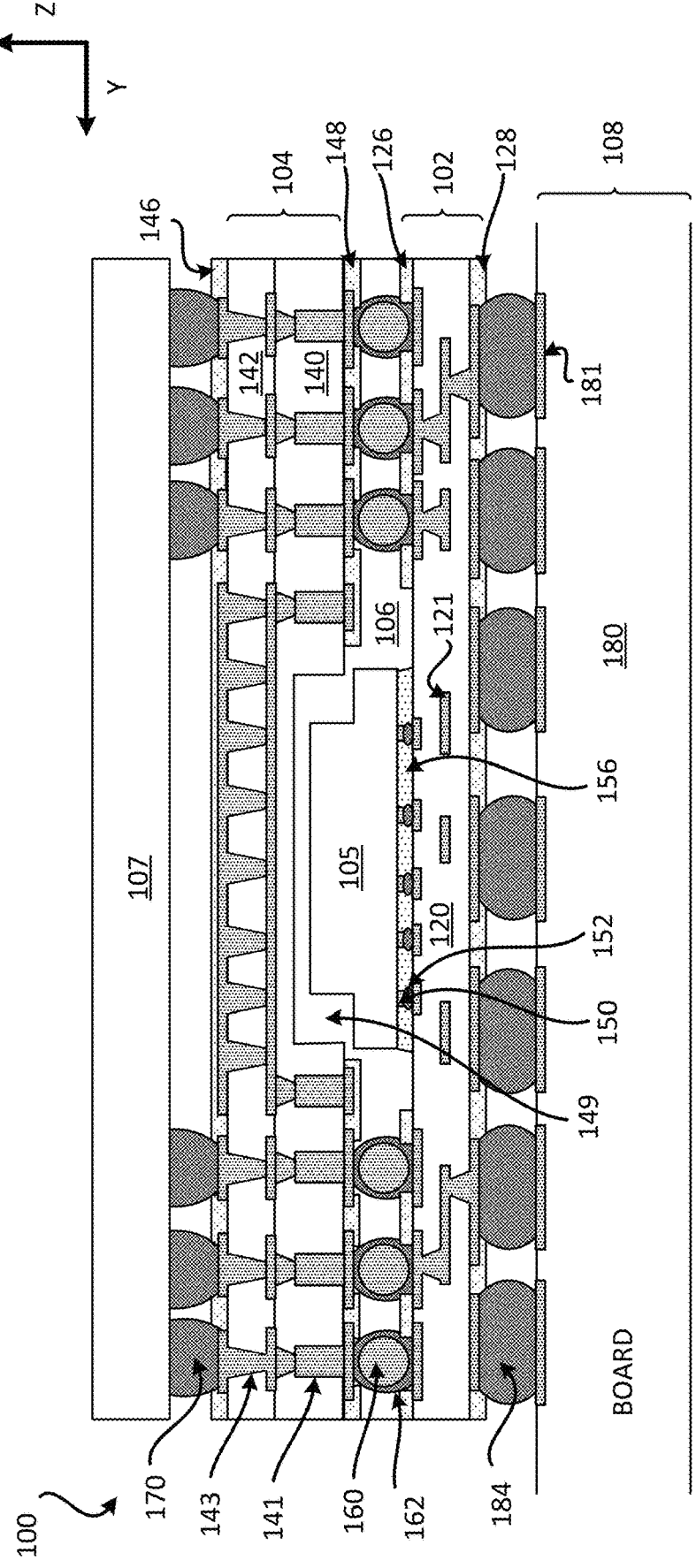
FIG. 1 illustrates an exemplary cross sectional profile view of a package that includes a substrate and an integrated device with a step back side.

Exemplary Package Comprising a Substrate and an Integrated Device with a Step Back Side FIG. 1 illustrates a cross sectional profile view of a package 100 that includes a substrate with a cavity and an integrated device comprising a step back side. The package 100 may be a package on package (PoP). The package 100 is coupled to a board 108 through a plurality of solder interconnects 184. The board 108 includes at least one board dielectric layer 180 and a plurality of board interconnects 181. The board 108 may include a printed circuit board (PCB).

The package 100 includes a substrate 102, a substrate 104, an integrated device 105, an underfill 156, an encapsulation layer 106, a plurality of ball interconnects 160, a plurality of solder interconnects 162 and an integrated device 107. The substrate 102 may be a first substrate and the substrate 104 may be a second substrate. The integrated device 105 may be a first integrated device and the integrated device 107 may be a second integrated device.

The substrate 102 includes at least one dielectric layer 120 and a plurality of interconnects 121, a solder resist layer 126 and a solder resist layer 128. The at least one dielectric layer 120 may include at least one first dielectric layer. The plurality of interconnects 121 may include a first plurality of interconnects. The substrate 104 includes at least one dielectric layer 140, at least one dielectric layer 142, a plurality of interconnects 141, a plurality of interconnects 143, a solder resist layer 146 and a solder resist layer 148. The at least one dielectric layer 140, and/or the at least one dielectric layer 142 may include at least one second dielectric layer. The plurality of interconnects 141 and/or the plurality of interconnects 143 may include a second plurality of interconnects. The substrate 104 may include a cavity 149. The cavity 149 may be include a trench. As will be further described below, the cavity 149 may be filled and/or occupied by one or more components and/or one or more materials that are not considered part of the substrate 104. The substrate 102 and/or the substrate 104 may include one or more metal layers. In some implementations, the substrate 102 and/or the substrate 104 may be fabricated using a modified semi-additive process (mSAP). In some implementations, the substrate 102 and/or the substrate 104 may be fabricated using an embedded trace substrate (ETS) process.

The integrated device 105 is coupled to the substrate 102. For example, the integrated device 105 may be coupled to a top surface (e.g., first surface) of the substrate 102 through a plurality of solder interconnects 152. In another example, the integrated device 105 may be coupled to the substrate 102 through a plurality of pillar interconnects 150 and a plurality of solder interconnects 152. An underfill 156 may be located between the integrated device 105 and the substrate 102. The underfill 156 may be coupled to the integrated device 105 and the substrate 102. The integrated device 105 includes a front side and a back side. As will be further described below in detail, the integrated device 105 may include a step back side. For example, the back side of the integrated device 105 may include a cross sectional profile that has a step profile. In one example, a die substrate (e.g., silicon substrate) of the integrated device 105 may include a step contour. The step back side of the integrated device 105 allows the cavity 149 of the substrate 104 to be smaller in size (e.g., smaller lateral size), which allows more interconnects to be formed in the substrate 104. In some implementations, a width (e.g., cavity width) of the cavity 149 is less than a width (e.g., longest/largest width) of the integrated device 105. In some implementations, a width of the cavity 149 is greater than a width (e.g., shortest/smallest width) of the back side of the integrated device 105. The use and/or configuration of a step back side also provides improved thermal performance for the integrated device 105 and/or the package 100. A die substrate is typically made of a material that has better thermal conductivity than that of an encapsulation layer (e.g., mold). Thinning the die substrate of the integrated device 105 to be as thin as possible may not produce a package with an efficient thermal dissipation configuration, since the encapsulation layer will not be an effective or efficient thermal conductor for the integrated device 105. However, by keeping the die substrate as thick as possible and selectively removing portions of the die substrate along one or more edges of the integrated device 105, the overall size of the cavity 149 may be reduced and/or thinned, which allows for more interconnects in the substrate 104, while keeping and/or minimizing the package size, and improving the thermal conductivity of the package, which helps improve the performance of the integrated device 105 and/or the package 100. Moreover, the use of the cavity in the substrate and the integrated device with a step back side may improve and/or reduce warpage in the package. A more detailed example of an integrated device comprising a step back side is further described below in at least FIG. 2.

The substrate 104 is coupled to the substrate 102 through a plurality of ball interconnects 160 and a plurality of solder interconnects 162. The plurality of ball interconnects 160 may include copper balls (e.g., copper core balls (CCBs)). In some implementations, the plurality of ball interconnects 160 may be optional. The plurality of ball interconnects 160 and/or a plurality of solder interconnects 162 may be coupled to the plurality of interconnects of the substrate 102 and the plurality of interconnects of the substrate 104. The plurality of ball interconnects 160 and the plurality of solder interconnects 162 may be located (e.g., located vertically) between the substrate 102 and the substrate 104. The substrate 104 is coupled to the substrate 102 such that a portion of the integrated device 105 is located at least partially in the cavity 149. For example, at least a portion of the back side of the integrated device 105 is located in the cavity 149 of the substrate 104. Thus, a portion of the integrated device 105 may be located laterally to the substrate 104. For example at least part of the back side of the integrated device 105 may be located laterally to the substrate 104.

The encapsulation layer 106 is coupled to and may touch the substrate 102, the substrate 104 and the integrated device 105. The encapsulation layer 106 may be coupled to the underfill 156. The encapsulation layer 106 is located between the substrate 102 and the substrate 104. The encapsulation layer 106 may be located (e.g., located vertically) between the substrate 104 and the integrated device 105. The encapsulation layer 106 may be located in at least part of the cavity 149 of the substrate 104. At least part of the encapsulation layer 106 may be located laterally to the substrate 104. The encapsulation layer 106 may touch the inside walls of the cavity 149 of the substrate 104. The encapsulation layer 106 may include a mold, a resin and/or an epoxy. The encapsulation layer 106 includes a material that is different from the dielectric layers of the substrate 102 and/or the dielectric layers of the substrate 104.

The integrated device 107 is coupled to the substrate 104. For example, the integrated device 107 is coupled to a top surface (e.g., first surface) of the substrate 104 through a plurality of solder interconnects 170. The plurality of solder interconnects 170 are coupled to the plurality of interconnects 143.

Exemplary Integrated Device

Figure 2:
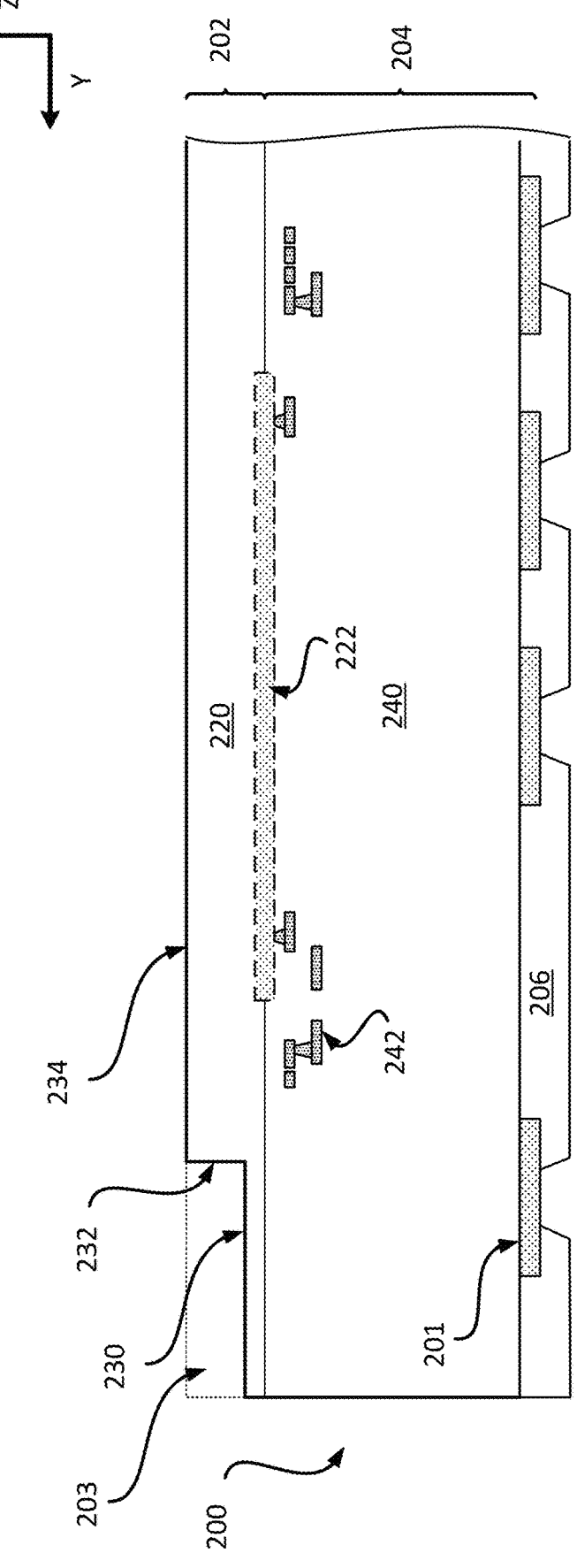
FIG. 2 illustrates an exemplary cross sectional profile view of an integrated device with a step back side.

FIG. 2 illustrates a cross sectional profile view of an integrated device 200 that includes a step back side. The integrated device 200 includes a substrate portion 202 and a die interconnection portion 204. The substrate portion 202 includes a die substrate 220 and an active region 222. The active region 222 may include a plurality of logic cells, a plurality of transistors, and/or a plurality of filters. Different implementations may use different types of transistors, such as a field effect transistor (FET), planar FET, finFET, and a gate all around FET. In some implementations, a front end of line (FEOL) process may be used to fabricate the active region 222 of the die substrate 220. The integrated device 200 may represent the integrated device 105.

The die substrate 220 may include silicon (Si). The die substrate 220 may comprise a bulk silicon. The bulk silicon may include a monolith silicon. The die substrate 220 may include a cut out portion 203. The die substrate 220 may have a step contour. For example, part of the die substrate 220 may have a profile cross section of a step (e.g., step cross section profile). The cut out portion 203 may help form/define the step back side of the integrated device. The cut out portion 203 may be located along one or more edges of the die substrate 220. A step back side of a die substrate and/or a step back side of an integrated device as used in the disclosure, may include a first horizontal surface, a vertical surface coupled to the first horizontal surface, and a second horizontal surface coupled to the vertical surface. For example, a step back side of a die substrate and/or a step back side of an integrated device may include a first horizontal surface (e.g., 230) of the die substrate 220, a vertical surface (e.g., 232) of the die substrate 220 coupled to the first horizontal surface (e.g., 230) of the die substrate 220, and a second horizontal surface (e.g., 234) of the die substrate 220 coupled to the vertical surface (e.g., 232) of the die substrate 220. The first horizontal surface may be approximately parallel to the second horizontal surface. The first horizontal surface may be pointed in an approximately same direction as the second horizontal surface. Thus, as an example, if the first horizontal surface 230 faces/points in an upward direction, the second horizontal surface 234 may face/point in an upward direction. The first horizontal surface, the first vertical surface and/or the second horizontal surface may refer to outer surfaces of the die substrate 220. The first horizontal surface, the first vertical surface and/or the second horizontal surface of the die substrate 220 may define a step contour (e.g., step outer contour) of the integrated device 200.

Different portions of the die substrate 220 may have different thicknesses, different widths and/or different lateral sizes. Examples of different thicknesses, different widths and/or different lateral sizes are further illustrated and described below in at least FIGS. 3 and 4.

The die interconnection portion 204 includes at least one dielectric layer 240 and a plurality of die interconnects 242. The die interconnection portion 204 is coupled to the substrate portion 202. The plurality of die interconnects 242 is coupled to the active region 222 of the substrate portion 202. The die interconnection portion 204 may also include a plurality of pad interconnects 201 and a passivation layer 206. In some implementations, a back end of line (BEOL) process may be used to fabricate the die interconnection portion 204. A plurality of pad interconnects 201 may be coupled to the plurality of die interconnects 242. A passivation layer 206 may be formed and coupled to the die interconnection portion 204.

In some implementations, an electrical path to and/or from an active region 222 may include at least one die interconnect from the plurality of die interconnects 242. In some implementations, an electrical path to and/or from an active region 222 may include at least one die interconnect from the plurality of die interconnects 242 and at least one pad interconnect from the plurality of pad interconnects 201.

Figure 3:
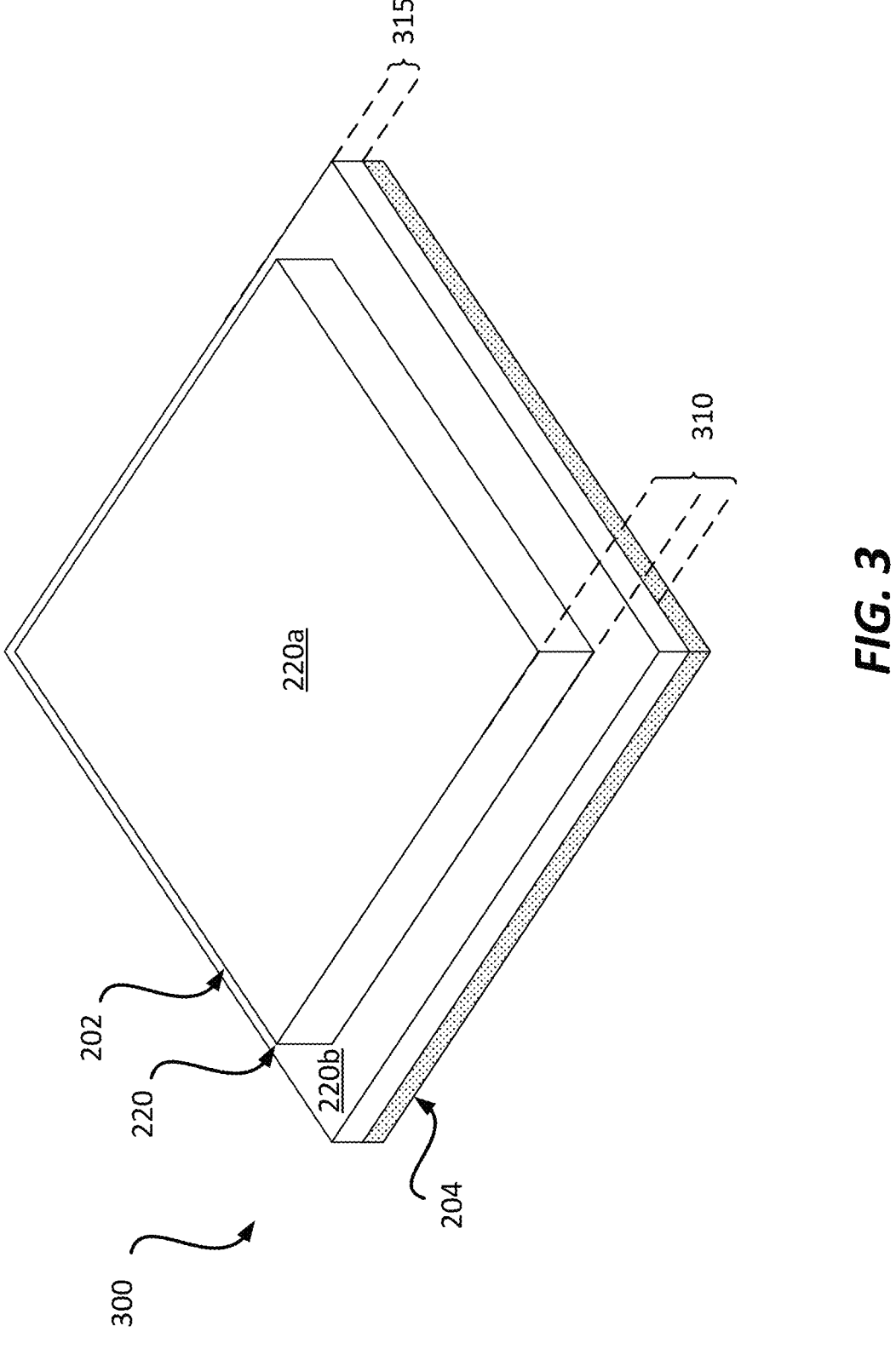
FIG. 3 illustrates an exemplary view of an integrated device with a step back side.

FIG. 3 illustrates an angled view of an integrated device with a step back side. The integrated device 300 may represent the integrated device 200 and/or the integrated device 105. The integrated device 300 includes the substrate portion 202 and the die interconnection portion 204. The substrate portion 202 includes a die substrate 220. The die substrate 220 includes a first die substrate portion 220a and a second die substrate portion 220b. The first die substrate portion 220a and the second die substrate portion 220b form and/or define a step back side of the integrated device 300. The first die substrate portion 220a has a first width that is less than the second width of the second die substrate portion 220b. The first die substrate portion 220a has a first lateral size that is less than the second lateral size of the second die substrate portion 220b. FIG. 3 illustrates that each edge of the integrated device 300 includes a step back side. For example, each edge of the integrated device 300 has a step cross sectional profile. Different implementations may have different lateral sizes and/or shapes for the first die substrate portion 220a and/or the second die substrate portion 220b. FIG. 3 illustrates that the die substrate 220 includes a first portion that includes a first thickness 310 and a second portion that includes a second thickness 315. The second thickness 315 may be different from the first thickness 310. The second thickness 315 may be less than the first thickness 310. In some implementations, the first die substrate portion 220a may be located at least partially in a cavity (e.g., 149) of a substrate (e.g., 104). In some implementations, the first die substrate portion 220a and the second die substrate portion 220b may be one continuous portion and/or contiguous portion.

Figure 4:
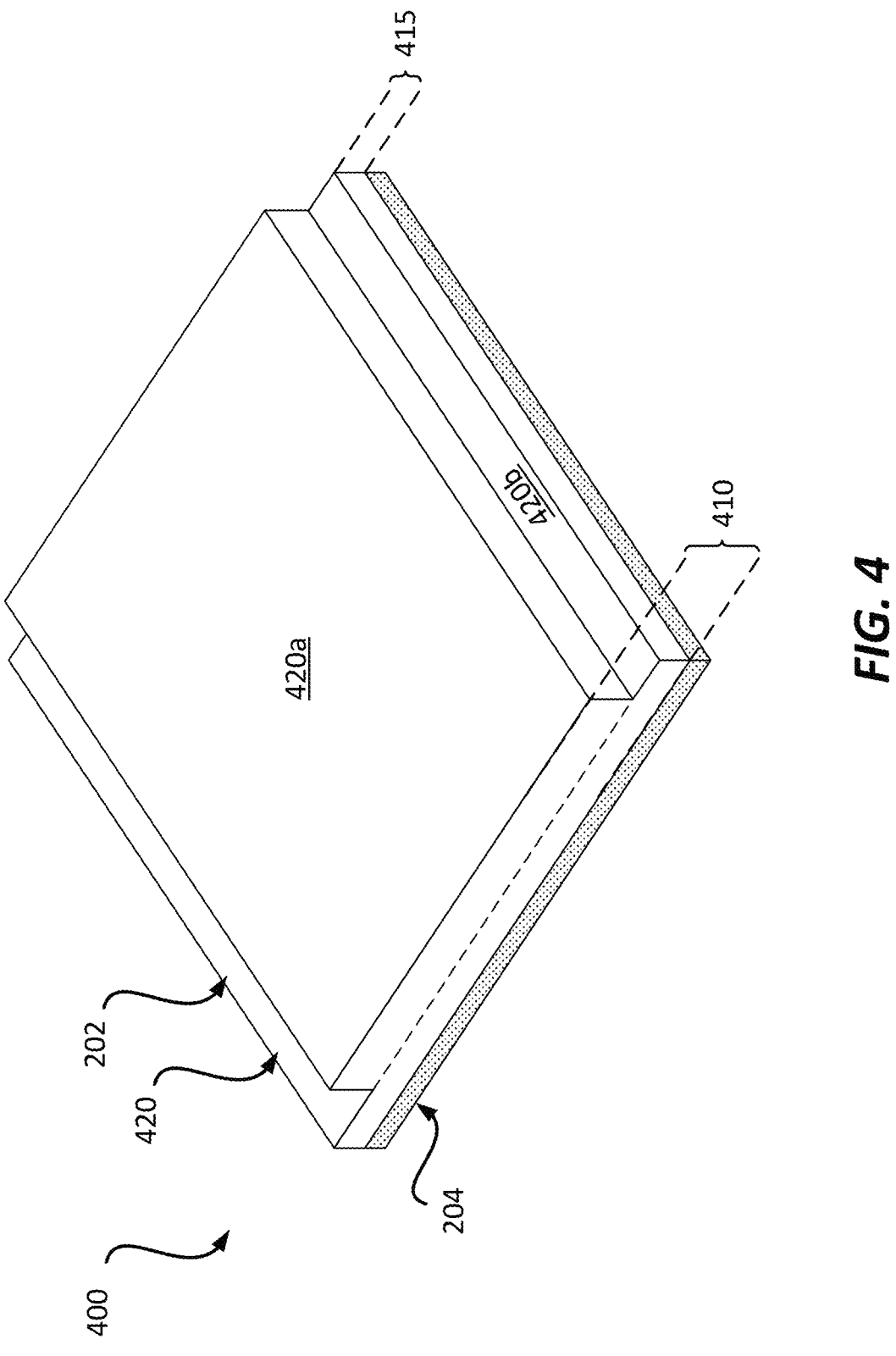
FIG. 4 illustrates an exemplary view of another integrated device with a step back side.

FIG. 4 illustrates an angled view of another integrated device with a step back side. The integrated device 400 may represent the integrated device 200 and/or the integrated device 105. The integrated device 400 includes the substrate portion 202 and the die interconnection portion 204. The substrate portion 202 includes a die substrate 420. The die substrate 420 includes a first die substrate portion 420a and a second die substrate portion 420b. The first die substrate portion 420a and the second die substrate portion 420b form and/or define a step back side of the integrated device 300. In a certain direction, the first die substrate portion 420a has a first width that is less than the second width of the second die substrate portion 420b. In another direction, the first die substrate portion 420a has a first width that is about the same as the second width of the second die substrate portion 420b. The first die substrate portion 420a has a first lateral size that is less than the second lateral size of the second die substrate portion 420b. In some implementations, the first die substrate portion 420a and the second die substrate portion 420b may be one continuous portion and/or contiguous portion. FIG. 4 illustrates that only some of the edges of the integrated device 300 include a step back side. For example, a first edge and a second edge of the integrated device 300 may have a step cross sectional profile. In some implementations, only one edge of an integrated device may have a step cross sectional profile. Different implementations may have different lateral sizes and/or shapes for the first die substrate portion 420a and/or the second die substrate portion 420b. In some implementations, the first die substrate portion 420a may be located at least partially in a cavity (e.g., 149) of a substrate (e.g., 104). FIG. 4 illustrates that the die substrate 420 includes a first portion that includes a first thickness 410 and a second portion that includes a second thickness 415. The second thickness 415 may be different from the first thickness 410. The second thickness 415 may be less than the first thickness 410.

A step back side of an integrated device as used in the disclosure, may include a first horizontal surface of the back side of the integrated, a vertical surface of the back side (e.g., side that includes the die substrate) of the integrated coupled to the first horizontal surface of the back side of the integrated, and a second horizontal surface of the back side of the integrated coupled to the vertical surface of the back side of the integrated. The first horizontal surface may be approximately parallel to the second horizontal surface. The first horizontal surface may be directed in an approximately same direction as the second horizontal surface. Thus, as an example, if the first horizontal surface faces/points in an upward direction, the second horizontal surface may face/point in an upward direction. The first horizontal surface, the first vertical surface and/or the second horizontal surface may refer to outer surfaces of the die substrate of an integrated device. The first horizontal surface, the first vertical surface and/or the second horizontal surface of the die substrate of an integrated device may define a step contour (e.g., step outer contour) of the integrated device.

An integrated device (e.g., 105, 107) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc . . . ). An integrated device may include an input/output (I/O) hub. An integrated device may include transistors. An integrated device may be an example of an electrical component and/or electrical device.

In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 100) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Figure 5:
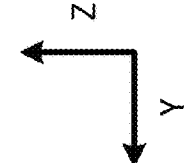
FIG. 5 illustrates an exemplary cross sectional profile view of a package that includes a substrate and an integrated device with a step back side.

Exemplary Package Comprising a Substrate and an Integrated Device With a Step Back Side FIG. 5 illustrates a close up view of the package 100. FIG. 5 illustrates an example of an electrical path between the integrated device 105 and the integrated device 107. The integrated device 105 is located at least partially in the cavity 149 of the substrate 104. Part of the encapsulation layer 106 may also be located at least partially in the cavity 149 of the substrate 104. FIG. 5 illustrates that the encapsulation layer 106 is located between the integrated device 105 and the substrate 104. Thus, the integrated device 105 is not directly touching the substrate 104. It is noted that the substrate 104 may still be considered to have the cavity 149, even if the cavity 149 is filled and/or occupied with other material and/or components that are not considered part of the substrate 104. In some implementations, a portion of the die substrate of the integrated device 105 is located in the cavity 149 of the substrate 104. At least a portion of the back side of the integrated device 105 is located laterally to the substrate 104. For example, at least a portion of the die substrate of the integrated device 105 is located laterally to the substrate 104. At least a portion of the die substrate of the integrated device 105 is located laterally to interconnects from the plurality of interconnects 141. For example, at least a portion of the die substrate of the integrated device 105 is located laterally to an interconnect 141a of the substrate 104. At least a portion of the die substrate of the integrated device 105 is located laterally to an interconnect that is coupled and/or touching the plurality of solder interconnects 162 and/or the plurality of ball interconnects 160. In some implementations, interconnects (e.g., trace interconnects, via interconnects, pad interconnects) of the substrate 104 that are located laterally to a back side of the integrated device 105 may also vertically overlap with the integrated device 105.

FIG. 5 illustrates an electrical path 501 between the integrated device 105 and the integrated device 107. The electrical path 501 may include (i) at least one pillar interconnect from the plurality of pillar interconnects 150, (ii) at least one solder interconnect from the plurality of solder interconnects 152, (iii) at least one interconnect from the plurality of interconnects 121, (iv) at least one solder interconnect from the plurality of solder interconnects 162, (v) at least one ball interconnect from the plurality of ball interconnects 160, (vi) at least one interconnect from the plurality of interconnects 141, (vii) at least one interconnect from the plurality of interconnects 143, and/or (viii) at least one solder interconnect from the plurality of solder interconnects 170.

Figure 6:
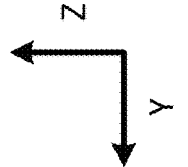
FIG. 6 illustrates an exemplary cross sectional profile view of another package that includes a substrate and an integrated device with a step back side.

FIG. 6 illustrates a close up view of a package 600. The package 600 is similar to the package 100 and includes the same or similar components that are arranged and/or configured in a similar manner as the package 100. However, in FIG. 6, the back side of the integrated device 105 touches the substrate 104. For example, the die substrate of the integrated device 105 may touch the at least one dielectric layer 140 of the substrate 104. A horizontal surface of the die substrate of the integrated device 105 may touch the substrate 104 while other horizontal surfaces of the die substrate of the integrated device 105 may not touch the substrate 104.

Figure 7:
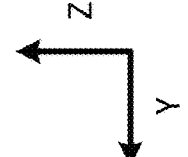
FIG. 7 illustrates an exemplary cross sectional profile view of another package that includes a substrate and an integrated device with a step back side.

Different implementations may use different configurations and/or arrangement of the step back side for an integrated device. FIG. 7 illustrates a close up view of a package 700. The package 700 is similar to the package 100 and includes the same or similar components that are arranged and/or configured in a similar manner as the package 100. However, in FIG. 7, the package 700 includes an integrated device 705 and a dummy die substrate 703. The dummy die substrate 703 is coupled to the back side of the integrated device 705 through an adhesive 730. The adhesive 730 may include a die attach film (DAF) material. The dummy die substrate 703 may include a silicon substrate (e.g., bulk silicon substrate, monolith silicon substrate). The dummy die substrate 703 may have a width that is less than the width of the integrated device 705. The dummy die substrate 703 may have a lateral size that is less than the lateral size of the integrated device 705. The dummy die substrate 703 may be a silicon substrate that is free of any active components and/or interconnects. The combination of the integrated device 705 and the dummy die substrate 703 provides an integrated device with a step back side. The dummy die substrate 703 may be considered part of the back side of the integrated device 705. A step back side of the integrated device 705 may include a first horizontal surface of the die substrate of the integrated device 705, a vertical surface of the dummy die substrate 703 coupled to the first horizontal surface, and a second horizontal surface of the dummy die substrate 703 coupled to the vertical surface of the dummy die substrate 703. The first horizontal surface of the die substrate of the integrated device 705 may be approximately parallel to the second horizontal surface of the dummy die substrate 703. The first horizontal surface may be pointed in an approximately same direction as the second horizontal surface. Thus, as an example, if the first horizontal surface faces/points in an upward direction, the second horizontal surface may face/point in an upward direction.

The back side of the integrated device 705 does not touch the substrate 104. For example the dummy die substrate 703 does not touch the substrate 104. However, in some implementations, the dummy die substrate 703 may touch the substrate. For example, the dummy die substrate 703 may touch the at least one dielectric layer 140 of the substrate 104.

In some implementations, at least a portion of the dummy die substrate 703 is located in the cavity 149 of the substrate 104. At least a portion of the dummy die substrate 703 is located laterally to the substrate 104. At least a portion of the dummy die substrate 703 is located laterally to interconnects from the plurality of interconnects 141. For example, at least a portion of the dummy die substrate 703 is located laterally to an interconnect 141a of the substrate 104. At least a portion of the dummy die substrate 703 is located laterally to an interconnect that is coupled and/or touching the plurality of solder interconnects 162 and/or the plurality of ball interconnects 160. In some implementations, interconnects of the substrate 104 that are located laterally to dummy die substrate 703 may also vertically overlap with the integrated device 705.

FIG. 7 illustrates an electrical path 701 between the integrated device 105 and the integrated device 107. The electrical path 701 may include (i) at least one pillar interconnect from the plurality of pillar interconnects 150, (ii) at least one solder interconnect from the plurality of solder interconnects 152, (iii) at least one interconnect from the plurality of interconnects 121, (iv) at least one solder interconnect from the plurality of solder interconnects 162, (v) at least one ball interconnect from the plurality of ball interconnects 160, (vi) at least one interconnect from the plurality of interconnects 141, (vii) at least one interconnect from the plurality of interconnects 143, and/or (viii) at least one solder interconnect from the plurality of solder interconnects 170.

Figure 8:
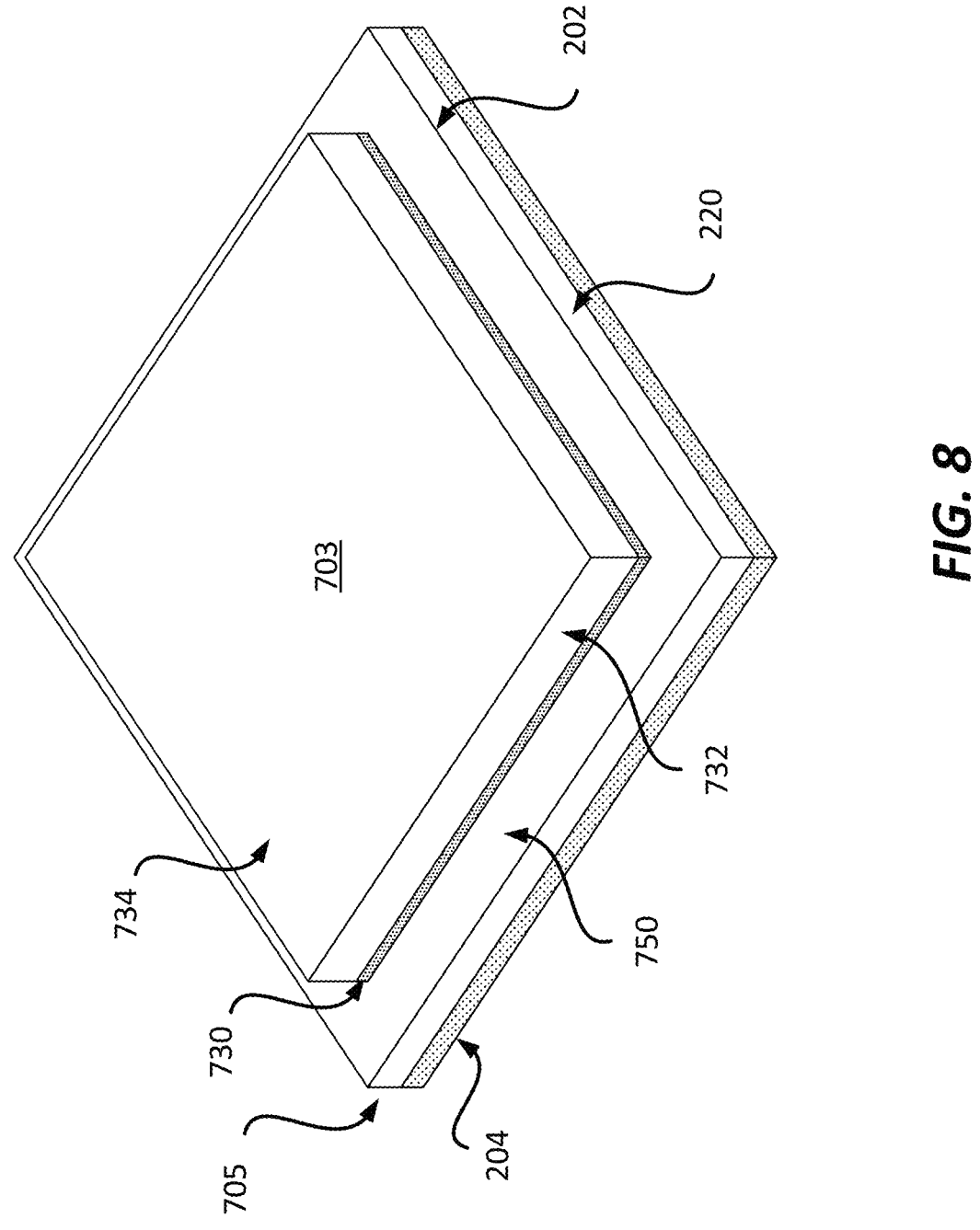
FIG. 8 illustrates an exemplary view of an integrated device with a step back side.

FIG. 8 illustrates an angled view of an integrated device with a step back side. The integrated device 800 may represent the integrated device 705. The integrated device 705 includes the substrate portion 202 and the die interconnection portion 204. The substrate portion 202 includes a die substrate 220. A dummy die substrate 703 is coupled to the integrated device 705 through an adhesive 730. The dummy die substrate 703 is coupled to the substrate portion 202 of the integrated device 705. The dummy die substrate 703 and the integrated device 705, may define an integrated device with a step back side, similar to the integrated device 105. The dummy die substrate 703 may be considered part of the integrated device 705. The dummy die substrate 703 has a width that is less than the width of the die substrate 220 of the integrated device 705. The dummy die substrate 703 has a lateral size that is less than the lateral size of the die substrate 220 of the integrated device 705. FIG. 8 illustrates that each edge of the integrated device 800 includes a step back side. For example, each edge of the integrated device 800 has a step cross sectional profile. Different implementations may have different lateral sizes and/or shapes for the dummy die substrate 703 and/or the die substrate 220. The dummy die substrate 703 may be a separate component from the die substrate 220 of the integrated device 705. However, both the dummy die substrate 703 and the die substrate 220 may include silicon.

As mentioned above, in some implementations, the combination of the integrated device 705 and the dummy die substrate 703 provides an integrated device with a step back side. The dummy die substrate 703 may be considered part of the back side of the integrated device 705. A step back side of the integrated device 705 may include a first horizontal surface (e.g., 750) of the die substrate of the integrated device 705, a vertical surface (e.g., 732) of the dummy die substrate 703 coupled to the first horizontal surface, and a second horizontal surface (e.g., 734) of the dummy die substrate 703 coupled to the vertical surface (e.g., 732) of the dummy die substrate 703. The vertical surface (e.g., 732) of the dummy die substrate 703 may be coupled to the first horizontal surface (e.g., 750) of the integrated device 705 through the adhesive 730. The first horizontal surface of the die substrate of the integrated device 705 may be approximately parallel to the second horizontal surface of the dummy die substrate 703. The first horizontal surface may be pointed in an approximately same direction as the second horizontal surface. Thus, as an example, if the first horizontal surface faces/points in an upward direction, the second horizontal surface may face/point in an upward direction. The first horizontal surface, the first vertical surface and/or the second horizontal surface may refer to outer surfaces of the integrated device 705 and/or outer surfaces of the dummy die substrate 703. The first horizontal surface, the first vertical surface and/or the second horizontal surface, as described above, may define a step contour (e.g., step outer contour) of the integrated device 705.

In some implementations, the dummy die substrate 703 may be located at least partially in a cavity (e.g., 149) of a substrate (e.g., 104).

The package (e.g., 100, 600, 700) may be implemented in a radio frequency (RF) package. The RF package may be a radio frequency front end (RFFE) package. A package (e.g., 100, 600, 700) may be configured to provide Wireless Fidelity (WiFi) communication and/or cellular communication (e.g., 2G, 3G, 4G, 5G). The packages (e.g., 100, 600, 700) may be configured to support Global System for Mobile (GSM) Communications, Universal Mobile Telecommunications System (UMTS), and/or Long-Term Evolution (LTE). The packages (e.g., 100, 600, 700) may be configured to transmit and receive signals having different frequencies and/or communication protocols.

Figure 9A:
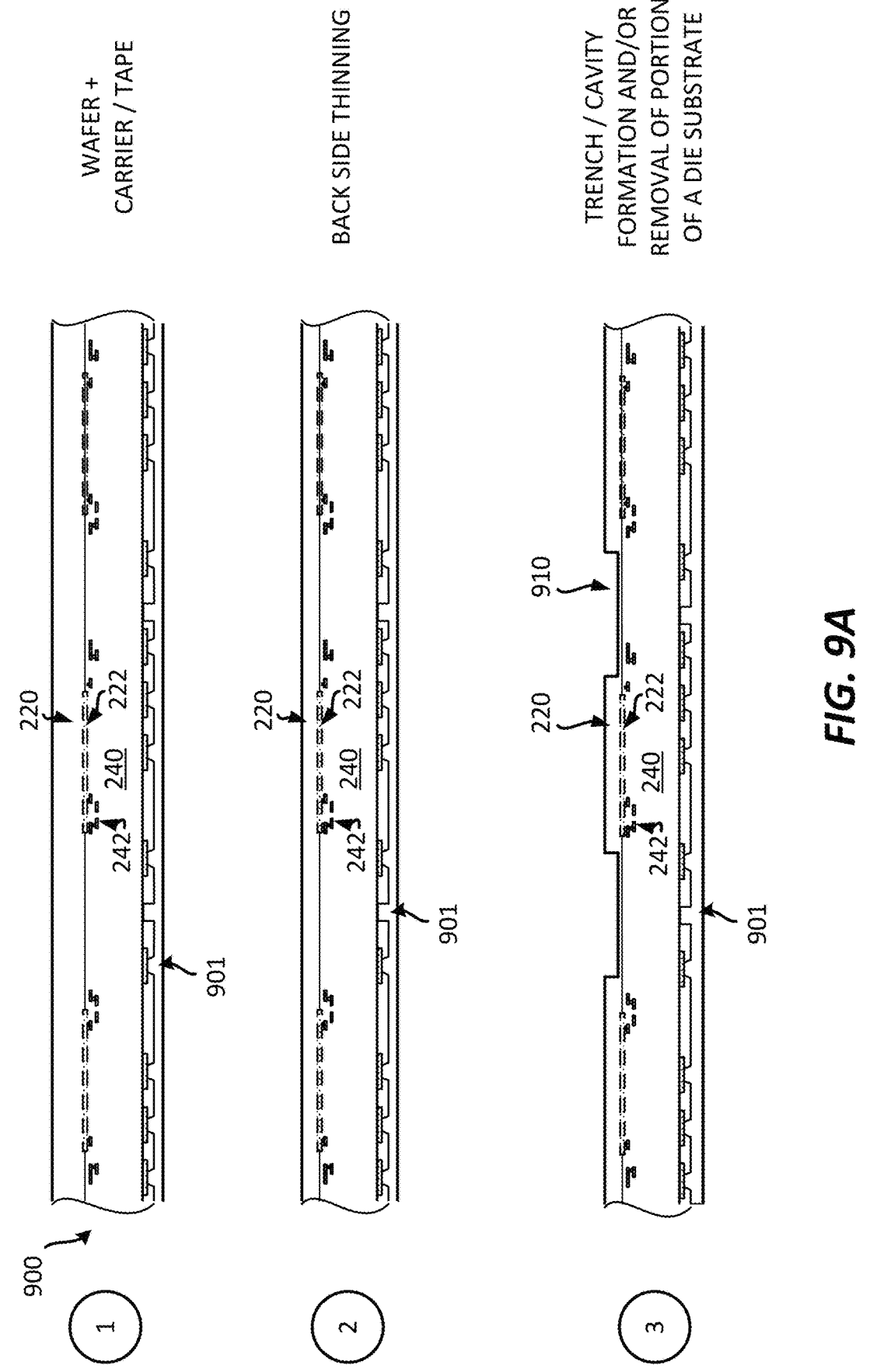
FIGS. 9A-9B illustrate an exemplary sequence for fabricating an integrated device with a step back side.
Figure 9B:
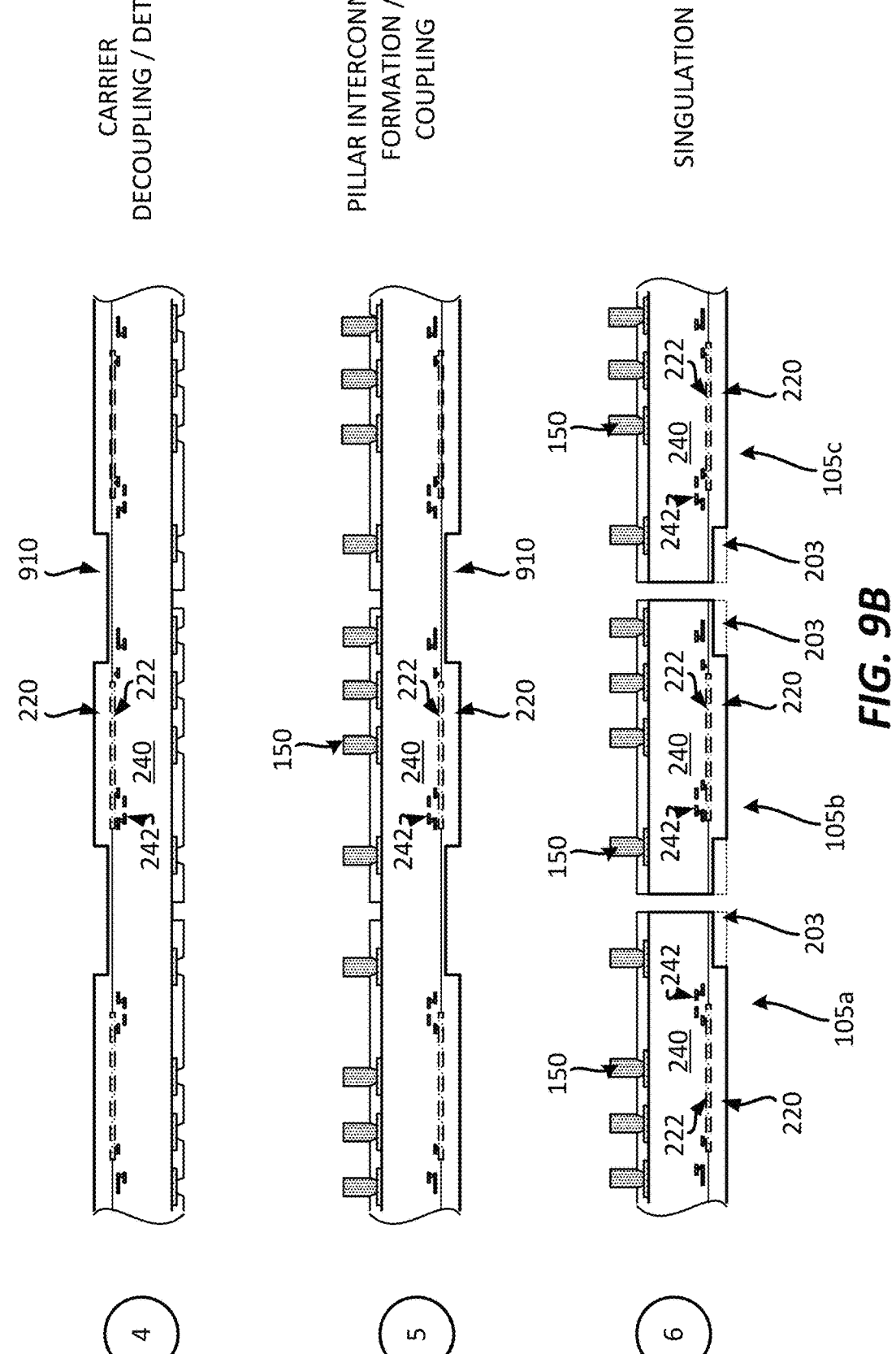

Having described various packages, a sequence for fabricating a package will now be described below.
Exemplary Sequence for Fabricating an Integrated Device Comprising a Step Back Side In some implementations, fabricating an integrated device includes several processes. FIGS. 9A-9B illustrate an exemplary sequence for providing or fabricating an integrated device. In some implementations, the sequence of FIGS. 9A-9B may be used to provide or fabricate the integrated device 105. However, the process of FIGS. 9A-9B may be used to fabricate any of the integrated devices (e.g., 200) described in the disclosure.

It should be noted that the sequence of FIGS. 9A-9B may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Stage 1, as shown in FIG. 9A, illustrates a state after a wafer 900 is provided. The wafer 900 may be provided over a carrier 901. The carrier 901 may include tape. The wafer 900 may be coupled to the carrier 901. The wafer 900 may include a die substrate 220, an active region 222, at least one dielectric layer 240, a plurality of die interconnects 242, a plurality of pad interconnects 201 and a passivation layer 206. The die substrate 220 may include a silicon substrate. The wafer 900 may include a silicon based wafer.

Stage 2 illustrates a state after the wafer 900 is thinned. In some implementations, the die substrate 220 is thinned. Different implementations may thin the wafer 900 and/or the die substrate 220 differently. In some implementations, the die substrate 220 of the wafer 900 may be thinned by about 150 micrometers.

Stage 3 illustrates a state after portions of the wafer 900 are removed. A sawing process (e.g., partial sawing process) may be used to remove portions of the die substrate 220 of the wafer 900. Removing portions of the die substrate 220 may form a plurality of cavities 910 in the die substrate 220 of the wafer 900. The plurality of cavities 910 may include a plurality of trenches. The plurality of cavities 910 may have different depths in the die substrate 220 of the wafer 900. For example, the plurality of cavities 910 may have a depth of about 50 micrometers in the die substrate 220. Other processes may be used to form the plurality of cavities 910.

Stage 4, as shown in FIG. 9B, illustrates a state after the wafer 900 has been decoupled from the carrier 901. The carrier 901 may be detached from the wafer 900. The carrier 901 may include a tape that is de-taped from the wafer 900.

Stage 5, illustrates a state after a plurality of pillar interconnects 150 are formed and coupled to the wafer 900. The plurality of pillar interconnects 150 may be coupled to the plurality of pad interconnects (e.g., 201). A plating process may be used to form the plurality of pillar interconnects 150.

Stage 6 illustrates a state after the wafer 900 is singulated into individual integrated devices (e.g., 105a, 105b, 105c). At least some of the integrated devices comprises a step back side, as described in at least FIGS. 1 and 2. The step back side of the integrated devices may be formed when the plurality of cavities 910 are formed.

Figure 10:
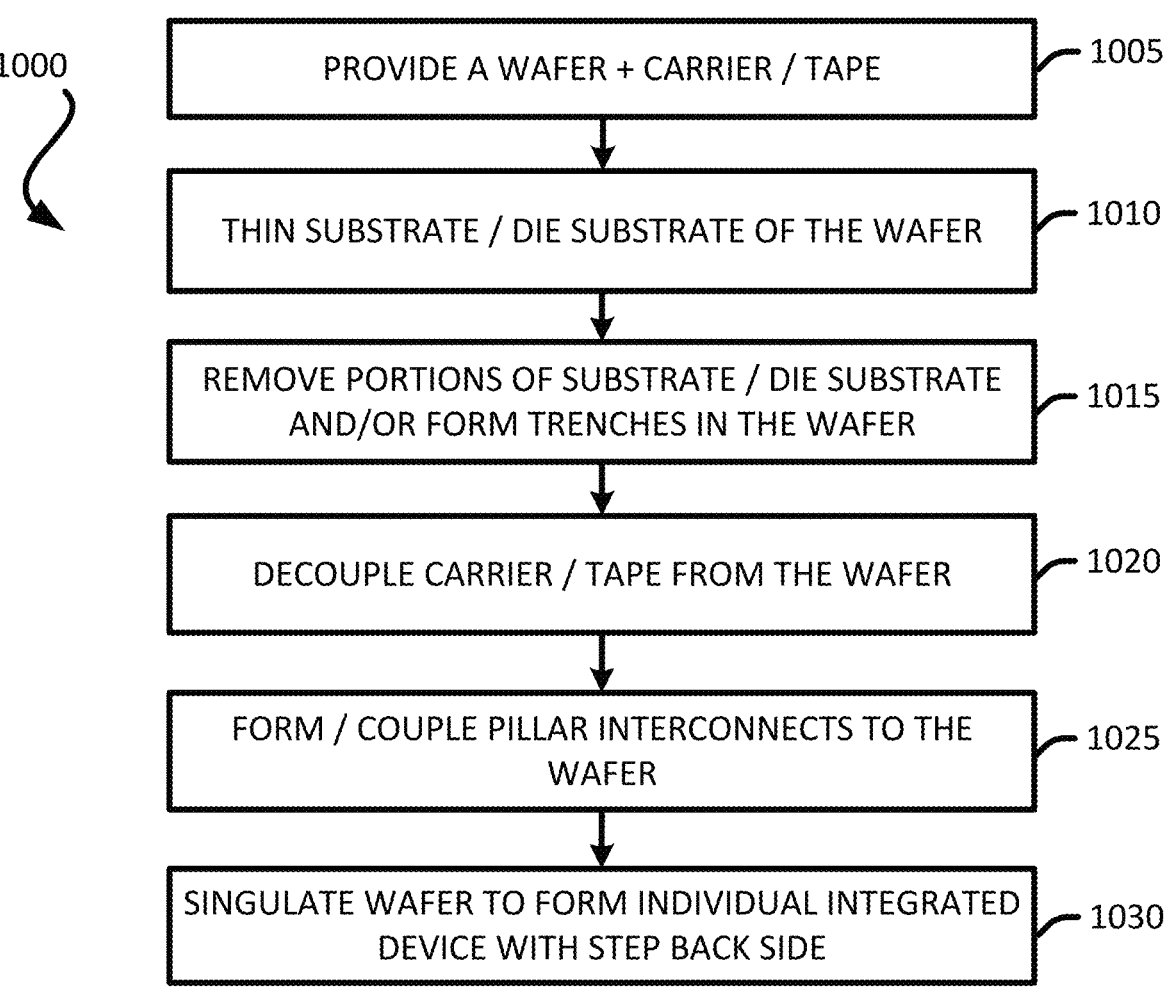
FIG. 10 illustrates an exemplary flow chart of a method for fabricating an integrated device with a step back side.

Exemplary Flow Diagram of a Method for Fabricating an Integrated Device Comprising a Step Back Side In some implementations, fabricating an integrated device includes several processes. FIG. 10 illustrates an exemplary flow diagram of a method 1000 for providing or fabricating an integrated device. In some implementations, the method 1000 of FIG. 10 may be used to provide or fabricate the integrated device 105 described in the disclosure. However, the method 1000 may be used to provide or fabricate any of the integrated devices (e.g., 200) described in the disclosure.

It should be noted that the method 1000 of FIG. 10 may combine one or more processes in order to simplify and/or clarify the method for providing or fabricating an integrated device. In some implementations, the order of the processes may be changed or modified.

The method provides (at 1005) a wafer and a carrier. Stage 1 of FIG. 9A, illustrates and describes an example of a state after a wafer 900 is provided. The wafer 900 may be provided over a carrier 901. The carrier 901 may include tape. The wafer 900 may be coupled to the carrier 901. The wafer 900 may include a die substrate 220, an active region 222, at least one dielectric layer 240, a plurality of die interconnects 242, a plurality of pad interconnects 201 and a passivation layer 206. The die substrate 220 may include a silicon substrate. The wafer 900 may include a silicon based wafer.

The method thins (at 1010) a die substrate of a wafer. Stage 2 of FIG. 9A, illustrates and describes an example of a state after the wafer 900 is thinned. In some implementations, the die substrate 220 is thinned. Different implementations may thin the wafer 900 and/or the die substrate 220 differently. In some implementations, the die substrate 220 of the wafer 900 may be thinned by about 150 micrometers.

The method removes (at 1015) portions of the die substrate of a wafer. Stage 3 of FIG. 9A, illustrates and describes an example of a state after portions of the wafer 900 are removed. A sawing process (e.g., partial sawing process) may be used to remove portions of the die substrate 220 of the wafer 900. Removing portions of the die substrate 220 may form a plurality of cavities 910 in the die substrate 220 of the wafer 900. The plurality of cavities 910 may include a plurality of trenches. The plurality of cavities 910 may have different depths in the die substrate 220 of the wafer 900. For example, the plurality of cavities 910 may have a depth of about 50 micrometers in the die substrate 220.

The method decouples (at 1020) the carrier from the wafer. Stage 4 of FIG. 9B, illustrates and describes an example of a state after the wafer 900 has been decoupled from the carrier 901. The carrier 901 may be detached from the wafer 900. The carrier 901 may include a tape that is de-taped from the wafer 900.

The method forms and couples (at 1025) a plurality of pillar interconnects to the wafer. Stage 5 of FIG. 9B, illustrates and describes an example of a state after a plurality of pillar interconnects 150 are formed and coupled to the wafer 900. The plurality of pillar interconnects 150 may be coupled to the plurality of pad interconnects (e.g., 201). A plating process may be used to form the plurality of pillar interconnects 150.

The method singulates (at 1030) the wafer into individual integrated devices with step back sides. Stage 6 of FIG. 9B, illustrates and describes an example of a state after the wafer 900 is singulated into individual integrated devices (e.g., 105a, 105b, 105c). At least some of the integrated devices comprises a step back side, as described in at least FIGS. 1 and 2. The step back side of the integrated devices may be formed when the plurality of cavities 910 are formed.

Figure 11A:
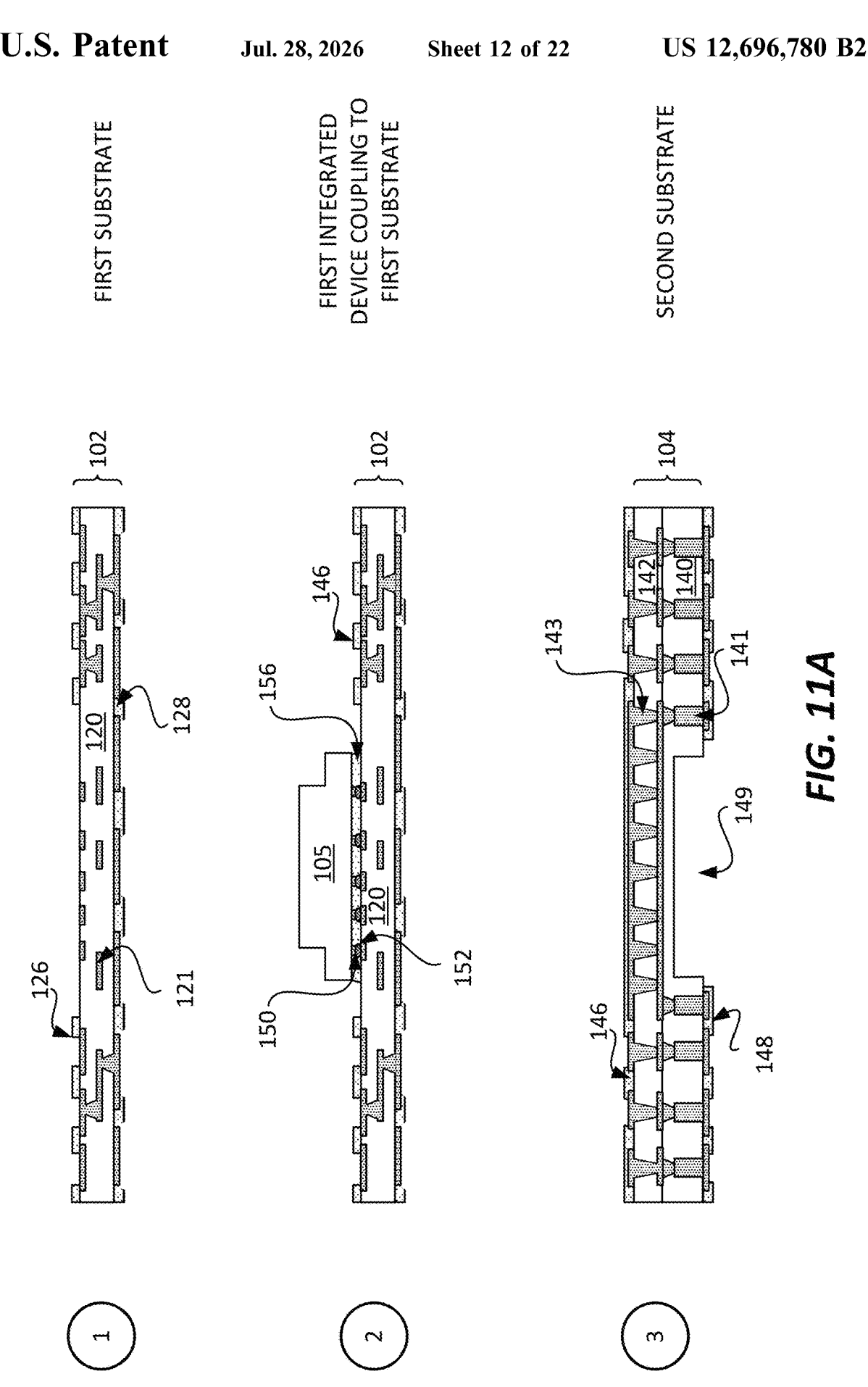
Figure 11B:
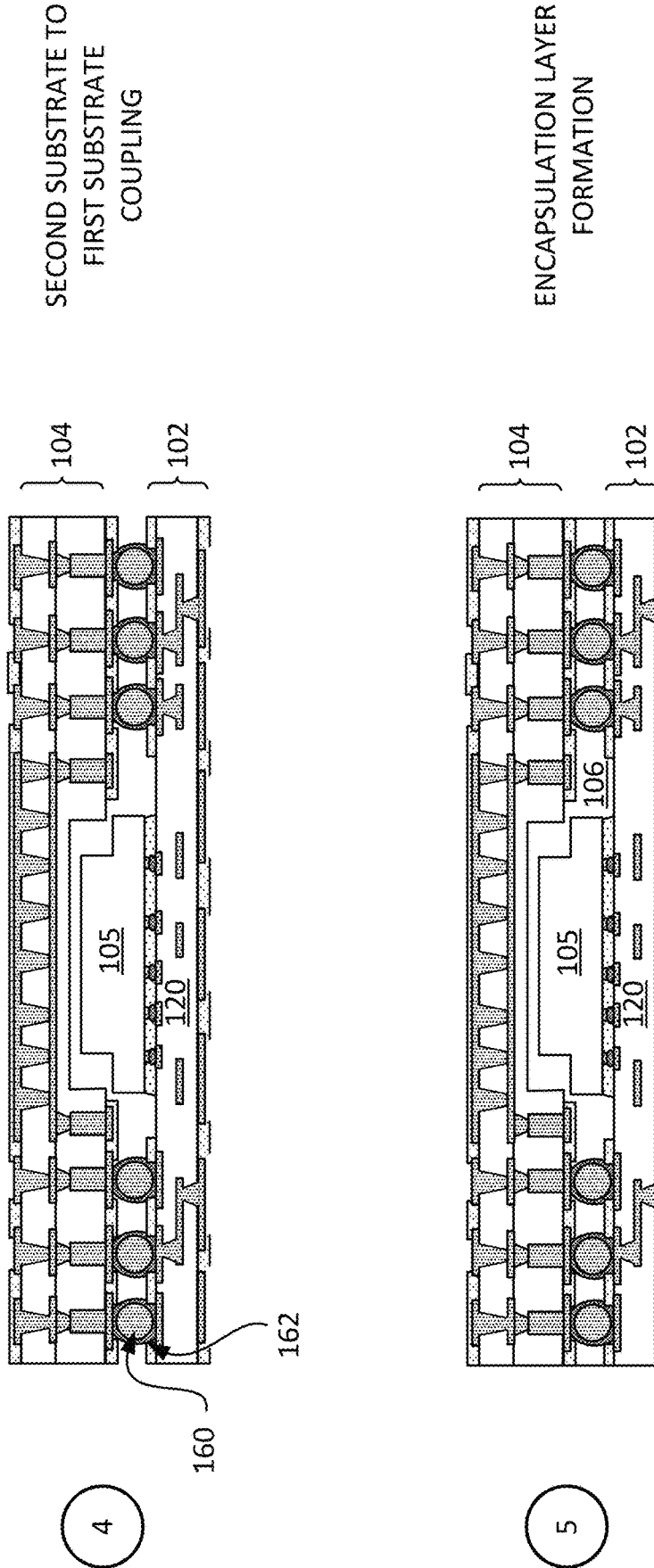

Exemplary Sequence for Fabricating a Package Comprising a Substrate and Integrated Device Comprising a Step Back Side In some implementations, fabricating a package includes several processes. FIGS. 11A-11C illustrate an exemplary sequence for providing or fabricating a package. In some implementations, the sequence of FIGS. 11A-11C may be used to provide or fabricate the package 100. However, the process of FIGS. 11A-11C may be used to fabricate any of the packages (e.g., 600, 700) described in the disclosure.

It should be noted that the sequence of FIGS. 11A-11C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 11A, illustrates a state after a substrate 102 is provided. The substrate 102 includes at least one dielectric layer 120 and a plurality of interconnects 121. The substrate 102 may be a first substrate. The substrate 102 may include a first surface (e.g., top surface) and a second surface (e.g., bottom surface). The substrate 102 may be fabricated using the method as described in FIGS. 14A-14D.

Stage 2 illustrates a state after an integrated device 105 is coupled to the first surface (e.g., top surface) of the substrate 102. The integrated device 105 may be a first integrated device. The integrated device 105 includes a step back side. The integrated device 105 may be coupled to the substrate 102 through the plurality of pillar interconnects 150 and a plurality of solder interconnects 152. A solder reflow process may be used to couple the integrated device 105 to the substrate 102. Stage 2 also illustrates an underfill 156 that is provided and/or formed between the integrated device 105 and the substrate 102.

Stage 3 illustrates a state after a substrate 104 is provided. The substrate 104 includes at least one dielectric layer 140, at least one dielectric layer 142, a plurality of interconnects 141, a plurality of interconnects 143, a solder resist layer 146 and a solder resist layer 148. The substrate 104 also includes at least one cavity 149. The substrate 104 may be a second substrate. The substrate 104 may include a first surface (e.g., top surface) and a second surface (e.g., bottom surface). The substrate 104 may be fabricated using the method as described in FIGS. 14A-14D.

Stage 4, as shown in FIG. 11B, illustrates a state after the substrate 104 is coupled to the substrate 102 through a plurality of ball interconnects 160 and the plurality of solder interconnects 162. A solder reflow process may be used to couple the substrate 104 to the substrate 102. The plurality of ball interconnects 160 may be coupled to the substrate 104 before the substrate 104 is coupled to the substrate 102. The substrate 104 is coupled to the substrate 102 such that the integrated device 105 is located between the substrate 102 and the substrate 104. The integrated device 105 may be located underneath the cavity (e.g., 149) of the substrate 104. At least part of the integrated device 105 may be located at least partially in the cavity 149 of the substrate 104. For example, at least some of the step back side of the integrated device 105 may be located at least partially in the cavity 149 of the substrate 104. The plurality of ball interconnects 160 and the plurality of solder interconnects 162 are coupled to (i) the plurality of interconnects 141 of the substrate 104 and (ii) the plurality of interconnects 121 of the substrate 102.

Stage 5 illustrates a state after an encapsulation layer 106 is provided between the substrate 102 and the substrate 104. The encapsulation layer 106 may encapsulate the integrated device 105, the plurality of ball interconnects 160 and/or the plurality of solder interconnects 162. The encapsulation layer 106 may be located in the cavity (e.g., 149) of the substrate 104. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

Stage 6, as shown in FIG. 11C, illustrates a state after an integrated device 107 is coupled to the first surface (e.g., top surface) of the substrate 104. The integrated device 107 may be coupled to the substrate 104 through the plurality of solder interconnects 170. A solder reflow process may be used to couple the integrated device 107 to the substrate 104.

Stage 7 illustrates a state after a plurality of solder interconnects 184 are coupled to the second surface of the substrate 102. A solder reflow process may be used to couple the plurality of solder interconnects 184 to the substrate 102. Stage 8 may illustrate the package 100. The package 100 may be fabricated one at a time or may be fabricated together as part of one or more wafers and then singulated into individual packages.

Exemplary Flow Diagram of a Method for Fabricating a Package Comprising a Substrate and an Integrated Device Comprising a Step Back Side In some implementations, fabricating a package includes several processes. FIG. 12 illustrates an exemplary flow diagram of a method 1200 for providing or fabricating a package. In some implementations, the method 1200 of FIG. 12 may be used to provide or fabricate the package 100 described in the disclosure. However, the method 1200 may be used to provide or fabricate any of the packages (e.g., 600, 700) described in the disclosure.

It should be noted that the method 1200 of FIG. 12 may combine one or more processes in order to simplify and/or clarify the method for providing or fabricating a package. In some implementations, the order of the processes may be changed or modified.

The method provides (at 1205) a first substrate. Stage 1 of FIG. 11A, illustrates and describes an example of a state after a substrate 102 is provided. The substrate 102 includes at least one dielectric layer 120 and a plurality of interconnects 121. The substrate 102 may include a first surface (e.g., top surface) and a second surface (e.g., bottom surface). The substrate 102 may be fabricated using the method as described in FIGS. 14A-14D.

The method couples (at 1210) a first integrated device to the first substrate, where the first integrated device includes a step back side back. Examples of an integrated devices with a step back side are described in at least FIGS. 1-8. Stage 2 of FIG. 11A, illustrates and describes an example of a state after an integrated device 105 is coupled to the first surface (e.g., top surface) of the substrate 102. The integrated device 105 may be coupled to the substrate 102 through the plurality of pillar interconnects 150 and a plurality of solder interconnects 152. A solder reflow process may be used to couple the integrated device 105 to the substrate 102. Stage 2 also illustrates an underfill 156 that is provided and/or formed between the integrated device 105 and the substrate 102.

The method provides (at 1215) a second substrate that includes a cavity. Stage 3 of FIG. 11A, illustrates and describes an example of a state after a substrate 104 is provided. The substrate 104 includes at least one dielectric layer 140, at least one dielectric layer 142, a plurality of interconnects 141, a plurality of interconnects 143, a solder resist layer 146 and a solder resist layer 148. The substrate 104 also includes at least one cavity 149. The substrate 104 may include a first surface (e.g., top surface) and a second surface (e.g., bottom surface). The substrate 104 may be fabricated using the method as described in FIGS. 14A-14D.

The method couples (at 1220) the second substrate to the first substrate. Stage 4 of FIG. 11B, illustrates and describes an example of a state after the substrate 104 is coupled to the substrate 102 through a plurality of ball interconnects 160 and the plurality of solder interconnects 162. A solder reflow process may be used to couple the substrate 104 to the substrate 102. The plurality of ball interconnects 160 may be coupled to the substrate 104 before the substrate 104 is coupled to the substrate 102. The substrate 104 is coupled to the substrate 102 such that the integrated device 105 is located between the substrate 102 and the substrate 104. The integrated device 105 may be located underneath the cavity (e.g., 149) of the substrate 104. At least part of the integrated device 105 may be located at least partially in the cavity 149 of the substrate 104. For example, at least some of the step back side of the integrated device 105 may be located at least partially in the cavity 149 of the substrate 104. The plurality of ball interconnects 160 and the plurality of solder interconnects 162 are coupled to (i) the plurality of interconnects 141 of the substrate 104 and (ii) the plurality of interconnects 121 of the substrate 102.

The method forms (at 1225) an encapsulation layer between the first substrate and the second substrate. Stage 5 of FIG. 11B, illustrates and describes an example of a state after an encapsulation layer 106 is formed between the substrate 102 and the substrate 104. The encapsulation layer 106 may encapsulate the integrated device 105, the plurality of ball interconnects 160 and/or the plurality of solder interconnects 162. The encapsulation layer 106 may be located in the cavity (e.g., 149) of the substrate 104. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

The method couples (at 1230) a second integrated device to the second substrate. Stage 6 of FIG. 11C, illustrates and describes an example of a state after an integrated device 107 is coupled to the first surface (e.g., top surface) of the substrate 104. The integrated device 107 may be coupled to the substrate 104 through the plurality of solder interconnects 170. A solder reflow process may be used to couple the integrated device 107 to the substrate 104.

The method couples (at 1235) a plurality of solder interconnects to the first substrate. Stage 7 of FIG. 11B, illustrates and describes an example of a state after a plurality of solder interconnects 184 are coupled to the second surface of the substrate 102. A solder reflow process may be used to couple the plurality of solder interconnects 184 to the substrate 102. Stage 8 may illustrate the package 100. The package 100 may be fabricated one at a time or may be fabricated together as part of one or more wafers and then singulated into individual packages.

Figure 13:
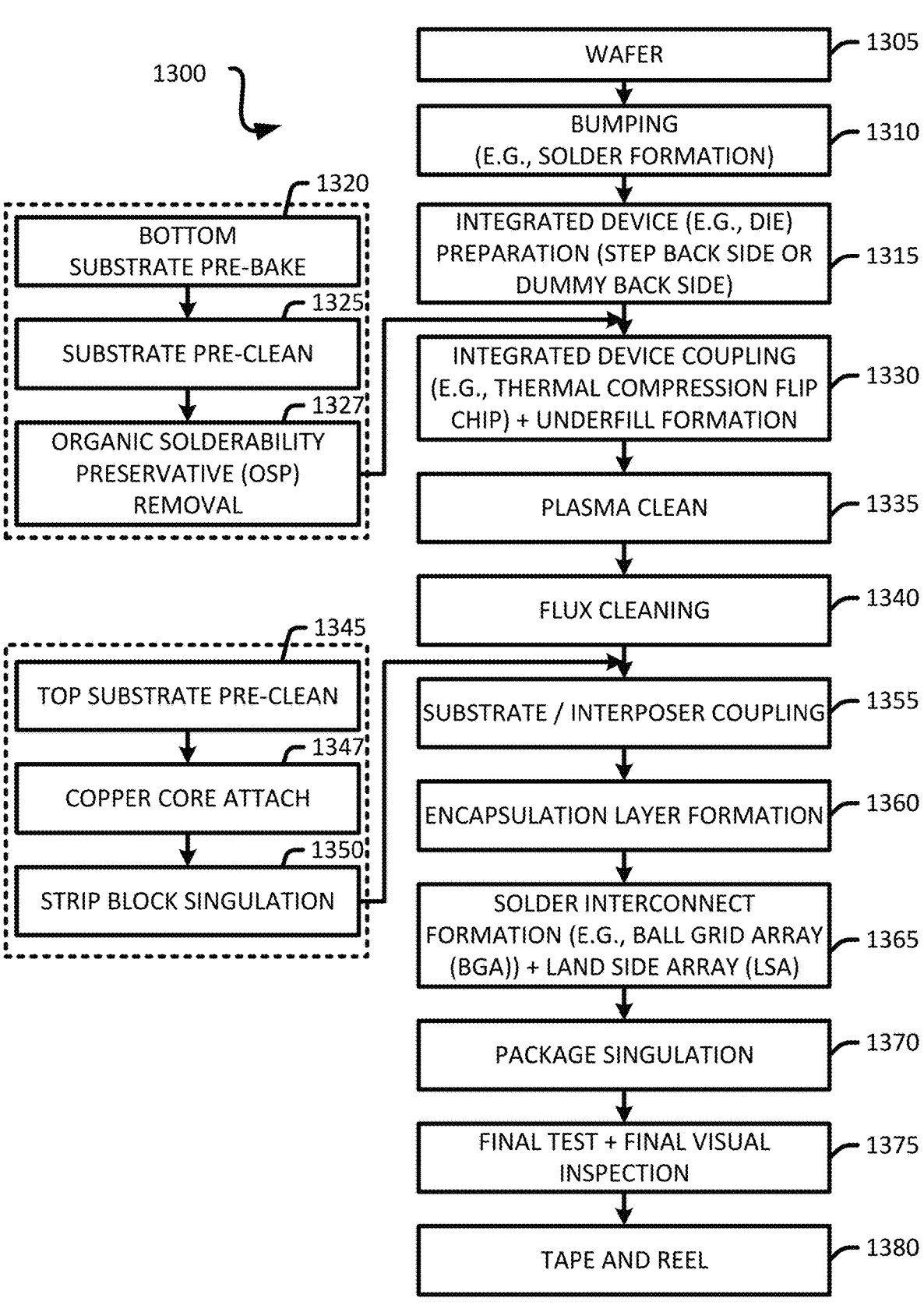
FIG. 13 illustrates an exemplary flow chart of a method for fabricating a package that includes a substrate and an integrated device with a step back side.

Exemplary Flow Diagram of a Method for Fabricating a Package Comprising Substrates and an Integrated Device Comprising a Step Back Side FIG. 13 illustrates an exemplary flow diagram of a method 1300 for providing or fabricating a package. In some implementations, the method 1300 of FIG. 13 may be used to provide or fabricate some or all of the package of FIG. 1 described in the disclosure. However, the method 1300 may be used to provide or fabricate any of the packages described in the disclosure.

It should be noted that the method 1300 of FIG. 13 may combine one or more processes in order to simplify and/or clarify the method for providing or fabricating a package. In some implementations, the order of the processes may be changed or modified.

The method provides (at 1305) a wafer. The wafer may serve as a substrate on which integrated devices may be formed and/or coupled to. In some implementations, other substrates may be coupled to the wafer. The wafer may include silicon. The wafer may serve as a base on which components are built over.

The method forms (at 1310) solder interconnects on the wafer. A solder reflow process may be used to form (e.g., couple) solder interconnects on the wafer.

The method prepares (at 1315) one or more integrated devices (e.g., dies) for coupling. Preparing the integrated devices may include fabricating the integrated devices. The integrated device may include a step back side as described in FIGS. 1-8. In some implementations, the integrated device may include a dummy die substrate that forms a step back side for the integrated device.

The method provides and prepares (at 1320) a first substrate (e.g., substrate 102, bottom substrate) by pre-baking the first substrate. The first substrate may be pre-baked to remove moisture on the first substrate to avoid outgassing during a subsequent thermal compression flip chip coupling process. The method pre-cleans (at 1325) the first substrate. The method removes (at 1327) organic solderability preservative (OSP) on the first substrate.

Once the first substrate is provided and prepared, the first substrate may be coupled to the wafer through the solder interconnects that are formed on the wafer.

The integrated device(s) is/are coupled (at 1330) to the first substrate. For example, the integrated device 105 may be coupled to the substrate 102 through a thermal compression flip chip process. An underfill may be provided between the integrated device and the substrate. Stage 2 of FIG. 11A illustrates and describes an example of an integrated device that is coupled to a substrate and an underfill that is provided between the integrated device and the substrate.

The method performs (at 1335) a plasma clean of the first substrate. The plasma clean may remove contamination on the surface of the substrate.

The method performs (at 1340) a flux cleaning of one or more substrates. Flux cleaning may remove oxides from metal of the substrate. The flux cleaning may be performed on the first substrate and/or the second substrate.

The method pre-cleans (at 1345) a second substrate (e.g., substrate 104, top substrate). Stage 3 of FIG. 11A illustrates and describes an example of a second substrate that is provided. The method couples (at 1347) ball interconnects (e.g., copper core ball) to the second substrate. The ball interconnects may be coupled to the substrate 104 through solder interconnects (e.g., 160). A solder reflow process may be used to couple the ball interconnects to the second substrate. The method performs (at 1350) strip block singulation of the second substrate. This may be done, when several substrates are fabricated at the same time and then subsequently singulated.

The method couples (at 1355) the second substrate (e.g., 104) to the first substrate (e.g., 102) through the ball interconnects. A solder reflow process may be used to couple the second substrate to the first substrate. Stage 4 of FIG.

11A illustrates and describes an example of coupling a substrate to another substrate.

The method provides (at 1360) an encapsulation layer (e.g., 1013) between the first substrate and the second substrate. Stage 5 of FIG. 11B illustrates and describes an example of providing an encapsulation layer between substrates.

The method forms (at 1365) solder interconnects or land side array (LSA) on the first substrate. A solder reflow process may be used to form the solder interconnects. The solder interconnects may be a ball grid array (BGA).

The method singulates (at 1370) the packages into individual packages. This may occur when several packages are fabricated at the same time. Singulating the package may include singulating the wafer that includes the first substrates, the integrated device(s), and the second substrates. A mechanical process (e.g., saw) or a laser may be used to singulate the packages.

The method performs (at 1375) a final test and final visual inspection of the package. This may include testing whether the package works properly by attaching probes to the package to determine whether the package works as intended. Visual inspection may include visually inspecting to see whether the package has any defects.

The method performs (at 1380) tape and reel of the packages. This may include packaging the singulated packages together with tape so that the package can be properly shipped.

It is noted that additional processes may be performed on the packages, including coupling other components, such as passive components and/or integrated devices to the packages. FIG. 13 illustrates an example of how packages may be fabricated. FIG. 13 is not intended to illustrate the only way that a package may be fabricated.

Exemplary Sequence for Fabricating a Substrate

FIGS. 14A-14D illustrate an exemplary sequence for providing or fabricating a substrate. In some implementations, the sequence of FIGS. 14A-14D may be used to provide or fabricate any of the substrate described in the disclosure. In some implementations, the sequence of FIGS. 14A-14D may be used to provide or fabricate a substrate (e.g., 102, 104) described in the disclosure.

It should be noted that the sequence of FIGS. 14A-14D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 14A:
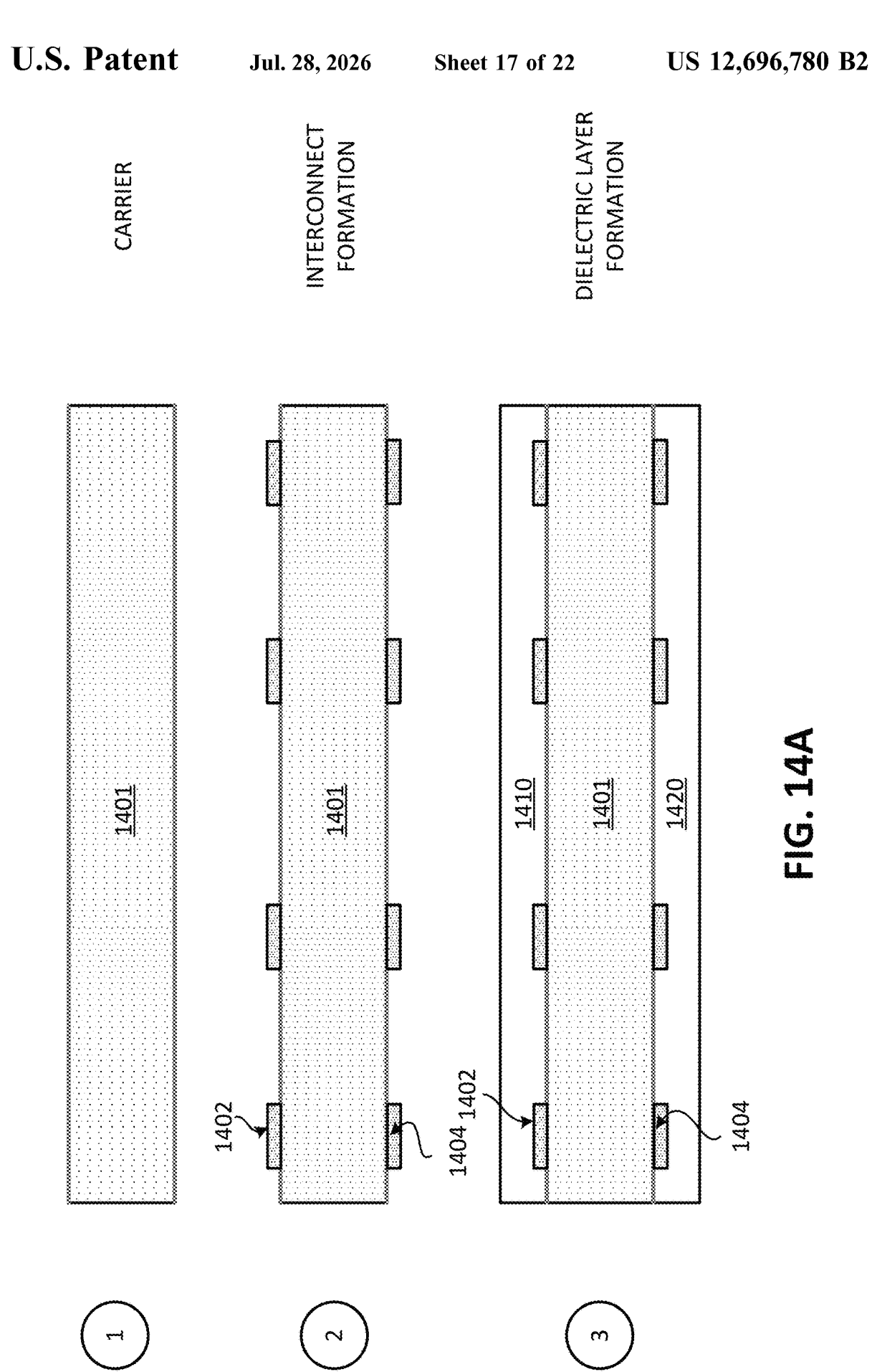

Stage 1, as shown in FIG. 14A, illustrates a state after a carrier 1401 is provided. The carrier 1401 may include a core layer. The core layer may include seed layers on surfaces of the core layer.

Stage 2 illustrates a state after a plurality of interconnects 1402 and a plurality of interconnects 1404. The plurality of interconnects 1402 may be coupled to a first surface (e.g., top surface) of the carrier 1401. The plurality of interconnects 1404 may be coupled to a second surface (e.g., bottom surface) of the carrier 1401. A plating process may be used to form the plurality of interconnects 1402 and the plurality of interconnects 1404.

Stage 3 illustrates a state after a dielectric layer 1410 and a dielectric layer 1420 are provided. The dielectric layer 1410 may be coupled to the first surface of the carrier 1401. The dielectric layer 1420 may be coupled to the second surface of the carrier 1401. A deposition and/or a lamination process may be used to form the dielectric layer 1410 and/or the dielectric layer 1420. The dielectric layer 1410 and/or the dielectric layer 1420 may include prepreg, polymer and/or Ajinomoto Build-up Film (ABF).

Figure 14B:
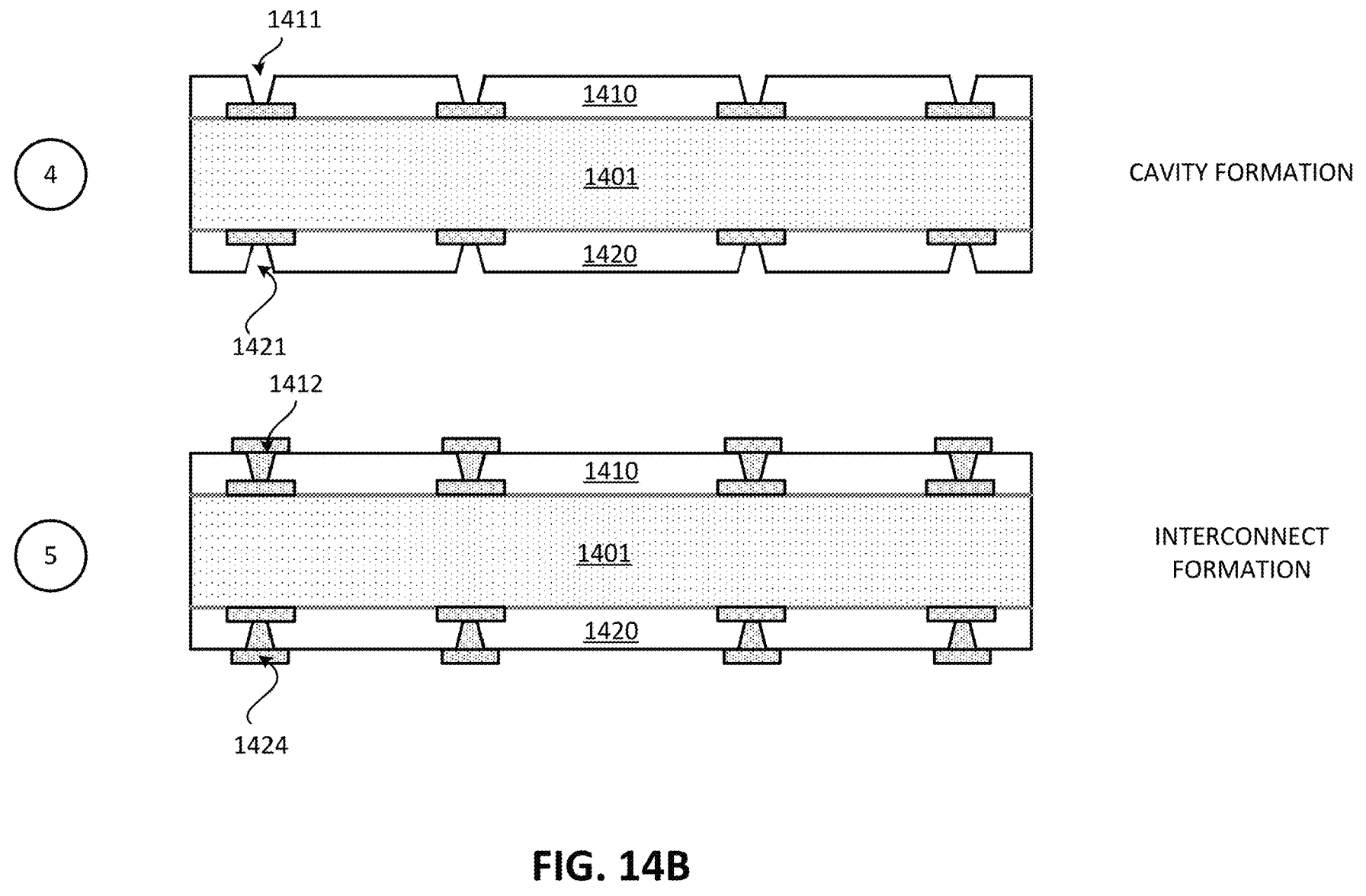

Stage 4 of FIG. 14B, illustrates a state after a plurality of cavities 1411 are formed in the dielectric layer 1410, and a plurality of cavities 1421 are formed in the dielectric layer 1420. An exposure and development process may be used to form the plurality of cavities 1411 in the dielectric layer 1410 and the plurality of cavities 1421 in the dielectric layer 1420. Different implementations may use different processes to form the plurality of cavities.

Stage 5 illustrates a state after a plurality of interconnects 1412 are formed in the dielectric layer 1410, and a plurality of interconnects 1424 are formed in the dielectric layer 1420. The plurality of interconnects 1412 may be coupled to the plurality of interconnects 1402. The plurality of interconnects 1414 may be coupled to the plurality of interconnects 1404. A plating process may be used to form the plurality of interconnects 1412 and/or the plurality of interconnects 1414.

Figure 14C:
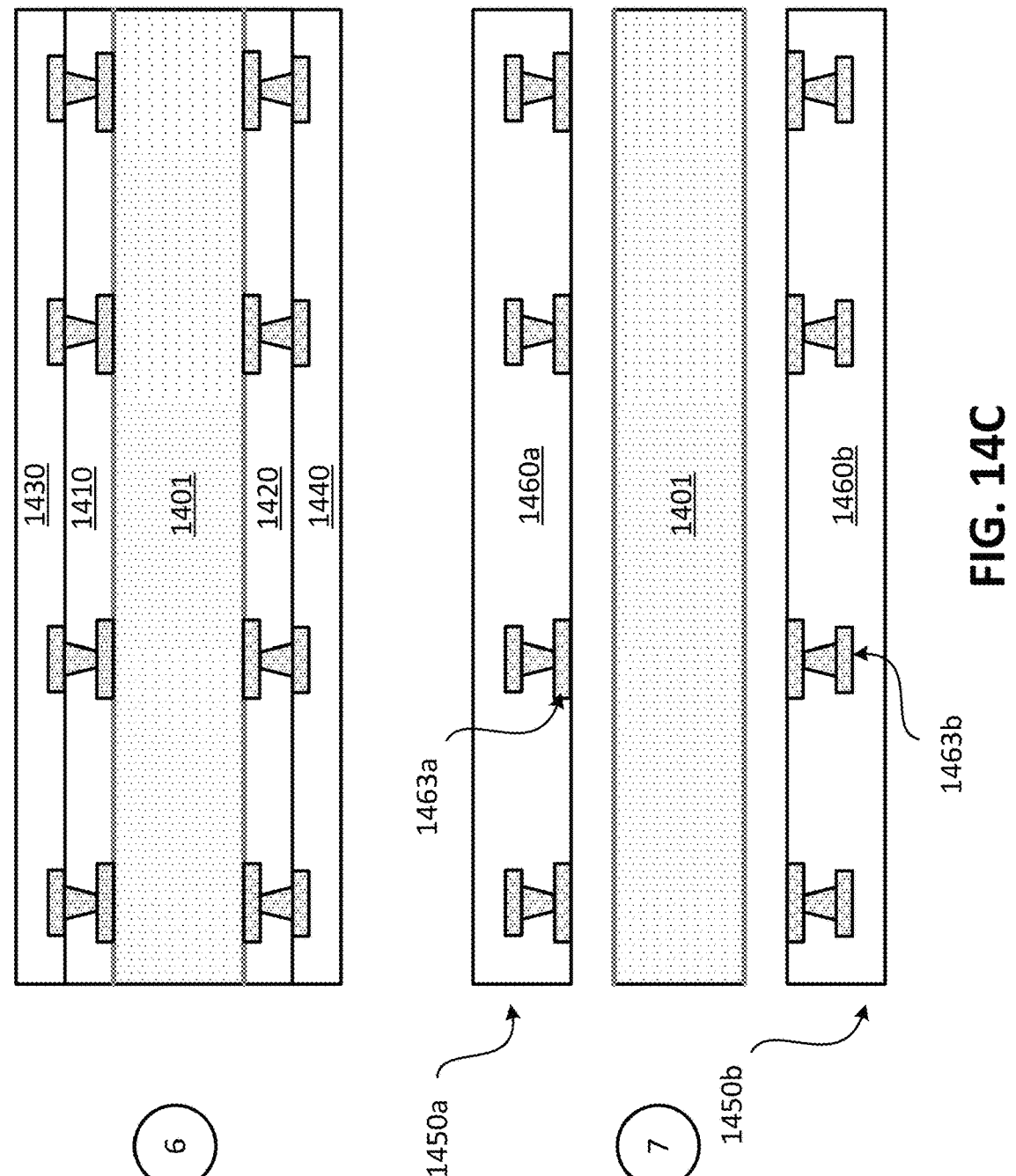

Stage 6, as shown in FIG. 14C, illustrates a state after dielectric layers are formed. For example, a dielectric layer 1430 may be formed and coupled to the dielectric layer 1410. A dielectric layer 1440 may be formed and coupled to the dielectric layer 1420. A lamination process and/or a deposition process may be used to form the dielectric layer 1430 and the dielectric layer 1440.

Stage 7 illustrates a state after the dielectric layers and the plurality of interconnects are separated from the carrier 1401 to form one or more substrates. For example, a substrate 1450a may include at least one dielectric layer 1460a and a plurality of interconnects 1463a, which has been separated from the carrier 1401. The at least one dielectric layer 1460a may represent the dielectric layer 1410 and/or the dielectric layer 1430. The plurality of interconnects 1463a may represent the plurality of interconnects 1402 and/or the plurality of interconnects 1412. A substrate 1450b may include at least one dielectric layer 1460b and a plurality of interconnects 1463b, which has been separated from the carrier 1401. The at least one dielectric layer 1460b may represent the dielectric layer 1420 and/or the dielectric layer 1440. The plurality of interconnects 1463b may represent the plurality of interconnects 1404 and/or the plurality of interconnects 1424. In some implementations, a portion of seed layers may be removed (e.g., etched out).

Figure 14D:
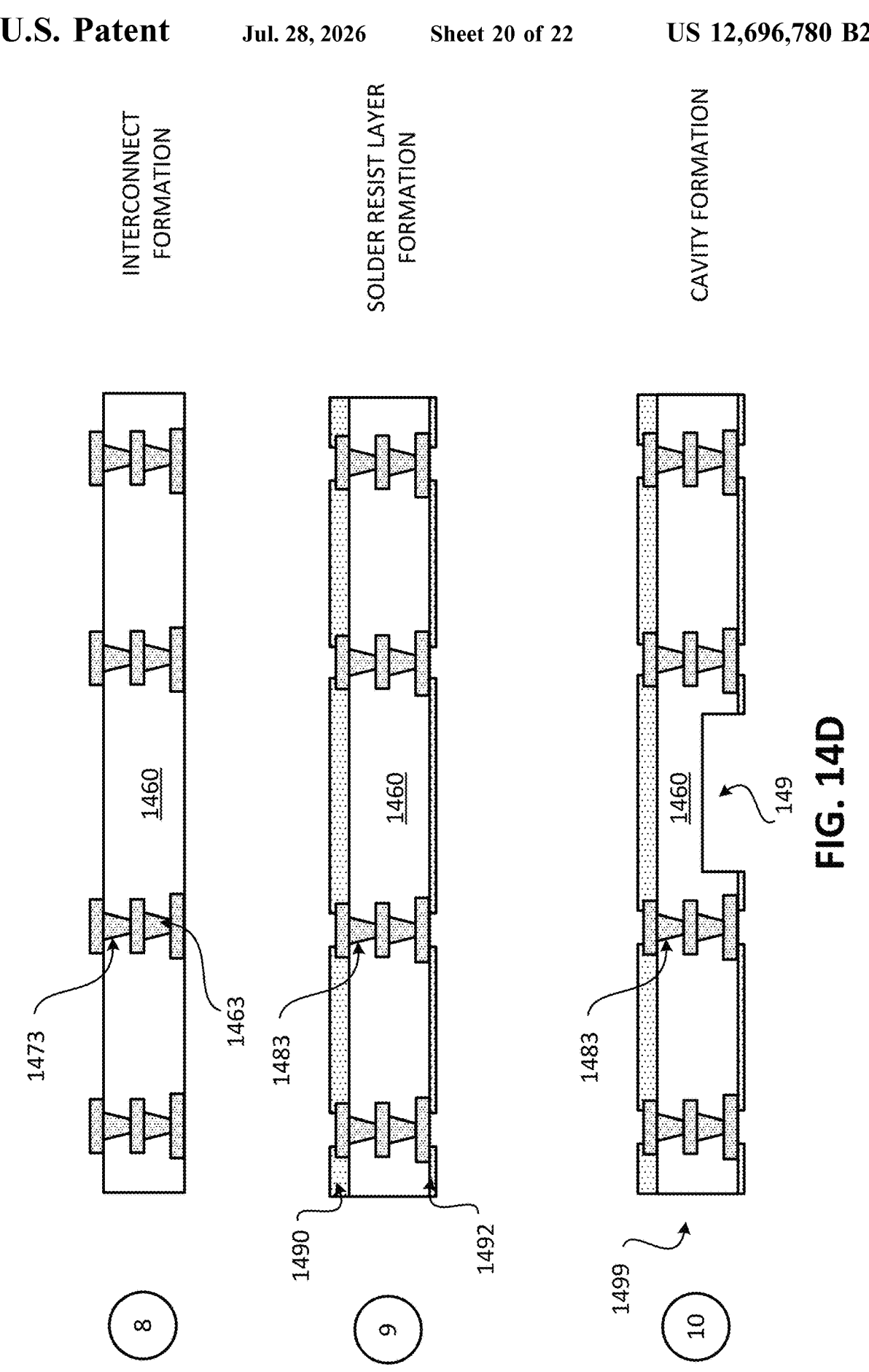

Stage 8, as shown in FIG. 14D, illustrates a state after a plurality of interconnects 1473 are formed. The plurality of 1473 may be coupled to the plurality of interconnects 1463. The plurality of interconnects 1463 may represent the plurality of interconnects 1402 and/or the plurality of interconnects 1412. The plurality of interconnects 1473 may be formed in the dielectric layer 1460. A plurality of cavities may be formed in the dielectric layer 1460 in a similar manner as described for forming a plurality of cavities in Stage 4 of FIG. 14B. The plurality of interconnects 1473 may be formed in a similar manner as described for fabricating a plurality of interconnects in Stage 5 of FIG. 14B.

Stage 9 illustrates a state after a solder resist layer 1490 and a solder resist layer 1492 are formed. The solder resist layer 1490 may be formed and coupled to a top surface of the substrate. The solder resist layer 1492 may be formed and coupled to a bottom surface of the substrate. The solder resist layer 1490 and/or the solder resist layer 1492 may include openings over interconnects. A lamination process may be used to the solder resist layer 1490 and/or the solder resist layer 1492.

Stage 10 illustrates a state after a cavity 149 are formed in the substrate 1499. The cavity 149 may be formed in the dielectric layer 1460 of the substrate 1499. In some implementations, a mechanical process may be used to form the cavity 149. For example, a saw may be used to form the cavity 149.

Exemplary Flow Diagram of a Method for Fabricating a Substrate

In some implementations, fabricating an interconnect block includes several processes. FIG. 15 illustrates an exemplary flow diagram of a method 1500 for providing or fabricating a substrate. In some implementations, the method 1500 of FIG. 15 may be used to provide or fabricate a substrate.

It should be noted that the method 1500 of FIG. 15 may combine one or more processes in order to simplify and/or clarify the method for providing or fabricating a substrate. In some implementations, the order of the processes may be changed or modified.

The method provides (at 1505) a carrier. Stage 1 of FIG. 14A, illustrates and describes an example of a state after a carrier 1401 is provided. The carrier 1401 may include a core layer. The core layer may include seed layers on surfaces of the core layer.

The method forms (at 1510) a plurality of interconnects. Stage 2 of FIG. 14A, illustrates and describes an example of a state after a plurality of interconnects 1402 and a plurality of interconnects 1404. The plurality of interconnects 1402 may be coupled to a first surface (e.g., top surface) of the carrier 1401. The plurality of interconnects 1404 may be coupled to a second surface (e.g., bottom surface) of the carrier 1401. A plating process may be used to form the plurality of interconnects 1402 and the plurality of interconnects 1404.

The method forms (at 1515) at least one dielectric. Stage 3 of FIG. 14A, illustrates and describes an example of a state after a dielectric layer 1410 and a dielectric layer 1420 are provided. The dielectric layer 1410 may be coupled to the first surface of the carrier 1401. The dielectric layer 1420 may be coupled to the second surface of the carrier 1401. A deposition and/or a lamination process may be used to form the dielectric layer 1410 and/or the dielectric layer 1420. The dielectric layer 1410 and/or the dielectric layer 1420 may include prepreg, polymer and/or Ajinomoto Build-up Film (ABF).

The method forms (at 1520) a plurality of interconnects. Forming the plurality of interconnects may include forming cavities in the dielectric layer. Stage 4 of FIG. 14B, illustrates and describes an example of a state after a plurality of cavities 1411 are formed in the dielectric layer 1410, and a plurality of cavities 1421 are formed in the dielectric layer 1420. An exposure and development process may be used to form the plurality of cavities 1411 in the dielectric layer 1410 and the plurality of cavities 1421 in the dielectric layer 1420. Different implementations may use different processes to form the plurality of cavities.

Stage 5 of FIG. 14B, illustrates and describes an example of a state after a plurality of interconnects 1412 are formed in the dielectric layer 1410, and a plurality of interconnects 1424 are formed in the dielectric layer 1420. The plurality of interconnects 1412 may be coupled to the plurality of interconnects 1402. The plurality of interconnects 1414 may be coupled to the plurality of interconnects 1404. A plating process may be used to form the plurality of interconnects 1412 and/or the plurality of interconnects 1414.

The method forms (at 1525) at least one other dielectric layer. Stage 6 of FIG. 14C, illustrates and describes an example of a state after dielectric layers are formed. For example, a dielectric layer 1430 may be formed and coupled to the dielectric layer 1410. A dielectric layer 1440 may be formed and coupled to the dielectric layer 1420. A lamination process may be used to form the dielectric layer 1430 and the dielectric layer 1440.

The method decouples (at 1530) the carrier from the dielectric layers and may remove portions of the seed layer. Stage 7 of FIG. 14C, illustrates and describes an example of a state after the dielectric layers and the plurality of interconnects are separated from the carrier 1401 to form one or more substrates. For example, a substrate 1450a may include at least one dielectric layer 1460a and a plurality of interconnects 1463a, which has been separated from the carrier 1401. The at least one dielectric layer 1460a may represent the dielectric layer 1410 and/or the dielectric layer 1430. The plurality of interconnects 1463a may represent the plurality of interconnects 1402 and/or the plurality of interconnects 1412. A substrate 1450b may include at least one dielectric layer 1460b and a plurality of interconnects 1463b, which has been separated from the carrier 1401. The at least one dielectric layer 1460b may represent the dielectric layer 1420 and/or the dielectric layer 1440. The plurality of interconnects 1463b may represent the plurality of interconnects 1404 and/or the plurality of interconnects 1424. In some implementations, a portion of seed layers may be removed (e.g., etched out).

The method forms (at 1535) a plurality of interconnects. Stage 8 of FIG. 14D, illustrates and describes an example of a state after a plurality of interconnects 1473 are formed. The plurality of 1473 may be coupled to the plurality of 1463. The plurality of interconnects 1463 may represent the plurality of interconnects 1402 and/or the plurality of interconnects 1412. The plurality of interconnects 1473 may be formed in the dielectric layer 1460. A plurality of cavities may be formed in the dielectric layer 1460 in a similar manner as the plurality of cavities that are described in Stage 4 of FIG. 14B. The plurality of interconnects 1473 may be formed in a similar manner as the plurality of interconnects described in Stage 5 of FIG. 14B.

The method forms (at 1540) at least one solder resist layer. Stage 9 of FIG. 14D, illustrates and describes an example of a state after a solder resist layer 1490 and a solder resist layer 1492 are formed. The solder resist layer 1490 may be formed and coupled to a top surface of the substrate. The solder resist layer 1492 may be formed and coupled to a bottom surface of the substrate. The solder resist layer 1490 and/or the solder resist layer 1492 may include openings over interconnects. A lamination process may be used to the solder resist layer 1490 and/or the solder resist layer 1492.

The method forms (at 1545) a cavity in the substrate. Stage 10 of FIG. 14D, illustrates and describes an example of a state after a cavity 149 are formed in the substrate 1499. The cavity 149 may be formed in the dielectric layer 1460 of the substrate 1499. In some implementations, a mechanical process may be used to form the cavity 149. For example, a saw may be used to form the cavity 149.

It is noted that the use and/or labeling of the first integrated device and the second integrated device is arbitrary. Any of the integrated devices may be the first integrated device and/or the second integrated device. It is noted that the use and/or labeling of the first substrate and the second substrate is arbitrary. Any of the substrates may be the first substrate and/or the second substrate.

Exemplary Electronic Devices

Figure 16:
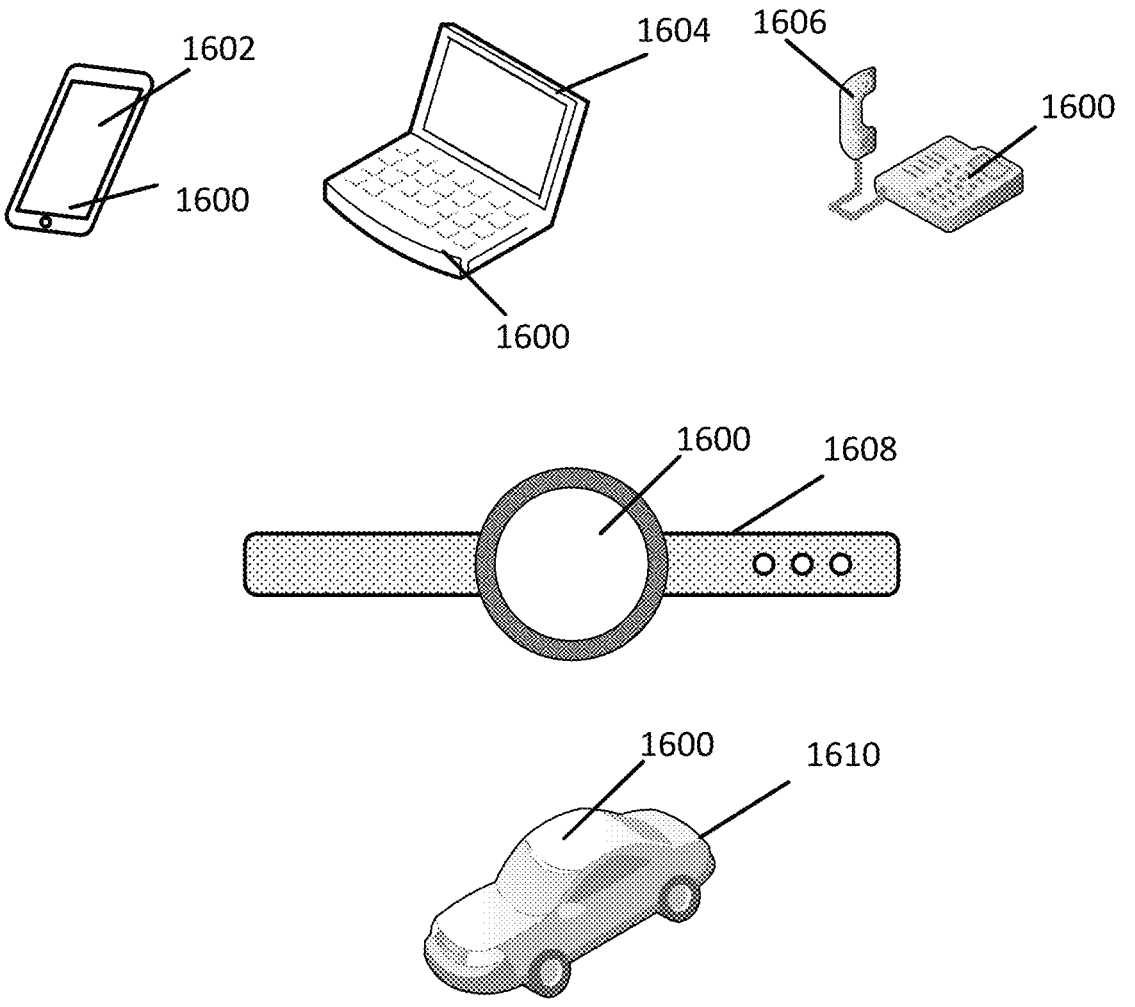
FIG. 16 illustrates various electronic devices that may integrate a die, an electronic circuit, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-8, 9A-9B, 10, 11A-11C, 12-13, 14A-14D and 15-16 may be rearranged and/or combined into a single component, process, feature or function or embodied in several components, processes, or functions. Additional elements, components, processes, and/ or functions may also be added without departing from the disclosure. It should also be noted FIGS. 1-8, 9A-9B, 10, 11A-11C, 12-13, 14A-14D and 15-16 and its corresponding description in the present disclosure is not limited to dies and/or ICs. In some implementations, FIGS. 1-8, 9A-9B, 10, 11A-11C, 12-13, 14A-14D and 15-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components. An object that "faces" another object may mean that a surface (e.g., outer surface) of the object may be face in the direction of the other object. An object that "faces" another object may mean that a surface (e.g., outer surface) of the object may be pointed in and/or directed in the direction of the other object. For example, an object A that has a first surface (e.g., first outer surface) that faces the second surface (e.g., second outer surface) of an object B, may mean that the first surface of object A may be pointed in the direction of the second surface of the object B. This may be the case even if there is one or more components between the first surface of object A and the second surface of object B. Thus, for example, if object A is coupled to object C, and object B is coupled to object C such that object C is between object A and object B, it may be possible that a surface of object A may be pointed in the direction of object B, despite the presence of object C between object A and object B. The direction in which an object faces and/or points towards may be a direction that is perpendicular to the surface (e.g., outer surface) of the object.

In some implementations, an interconnect is an element or component of a device or package that allows or facilitates an electrical connection between two points, elements and/ or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a first substrate; an integrated device coupled to the first substrate, wherein the integrated device comprises a step back side; a second substrate comprising a cavity, wherein the integrated device is located at least partially in the cavity of the second substrate; and an encapsulation layer coupled to the first substrate and the second substrate, wherein the encapsulation layer is located between the first substrate and the second substrate, and wherein the encapsulation layer is located at least partially in the cavity of the second substrate.

Aspect 2: The package of aspect 1, wherein the integrated device comprises a die substrate that includes a step contour.

Aspect 3: The package of aspect 2, wherein the die substrate comprises a first thickness and a second thickness that is different from the first thickness.

Aspect 4: The package of aspects 2 through 3, wherein a first portion of the die substrate comprises a first width, and wherein a second portion of the die substrate comprises a second width that is different from the first width.

Aspect 5: The package of aspects 2 through 4, further comprising a second die substrate coupled to the die substrate through an adhesive.

Aspect 6: The package of aspects 1 through 5, further comprising a plurality of ball interconnects and a plurality of solder interconnects coupled to the first substrate and the second substrate, wherein the plurality of ball interconnects and the plurality of solder interconnects are located between the first substrate and the second substrate.

Aspect 7: The package of aspect 6, wherein the plurality of ball interconnects include copper core balls (CCBs).

Aspect 8: The package of aspect 1 through 7, wherein the cavity has a cavity width that is less than a width of the integrated device.

Aspect 9: The package of aspects 1 through 8, wherein the first substrate comprises at least one first dielectric layer; and a first plurality of interconnects, and wherein the second substrate comprises: at least one second dielectric layer; and a second plurality of interconnects.

Aspect 10: The package of aspect 9, wherein the second plurality of interconnects of the second substrate comprise a plurality of trace interconnects that are located laterally to the integrated device.

Aspect 11: The package of aspect 9, wherein the second plurality of interconnects of the second substrate comprise a plurality of trace interconnects that are (i) located laterally to the integrated device and (ii) vertically overlap with a portion of the integrated device.

Aspect 12: The package of aspects 1 through 11, further comprising a second integrated device coupled to the second substrate through at least a plurality of solder interconnects.

Aspect 13: The package of aspects 1 through 11, wherein the integrated device is coupled to the first substrate through at least one a plurality of solder interconnects.

Aspect 14: The package of aspects 1 through 11, wherein the integrated device is coupled to the first substrate through at least a plurality of solder interconnects and a plurality of pillar interconnects.

Aspect 15: A method for fabricating a package. The method provides a first substrate. The method couples an integrated device to the first substrate, wherein the integrated device comprises a step back side. The method provides a second substrate comprising a cavity, wherein the second substrate is provided such that the integrated device is located at least partially in the cavity of the second substrate. The method forms an encapsulation layer that is coupled to the first substrate and the second substrate. The encapsulation layer is located between the first substrate and the second substrate. The encapsulation layer is located at least partially in the cavity of the second substrate.

Aspect 16: The method of aspect 15, wherein the integrated device comprises a die substrate that includes a step contour.

Aspect 17: The method of aspect 16, wherein the die substrate comprises a first thickness and a second thickness that is different from the first thickness.

Aspect 18: The method of aspects 16 through 17, wherein a first portion of the die substrate comprises a first width, and wherein a second portion of the die substrate comprises a second width that is different from the first width.

Aspect 19: The method of aspects 16 through 18, further comprising a second die substrate coupled to the die substrate.

Aspect 20: The method of aspects 15 through 19, wherein the second substrate is coupled to the first substrate through a plurality of ball interconnects and a plurality of solder interconnects, and wherein the plurality of ball interconnects and the plurality of solder interconnects are located between the first substrate and the second substrate.

Aspect 21: The package of claim 1, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first substrate;
an integrated device coupled to the first substrate, wherein the integrated device comprises a step back side, and the integrated device is coupled to the first substrate through at least a plurality of solder interconnects and a plurality of pillar interconnects;
a second substrate comprising a cavity, wherein the integrated device is located at least partially in the cavity of the second substrate; and
an encapsulation layer coupled to the first substrate and the second substrate,
wherein the encapsulation layer is located between the first substrate and the second substrate, and
wherein the encapsulation layer is located at least partially in the cavity of the second substrate.

2. The package of claim 1, wherein the integrated device comprises a die substrate that includes a step contour.

3. The package of claim 2, wherein the die substrate comprises a first thickness and a second thickness that is different from the first thickness.

4. The package of claim 2,
wherein a first portion of the die substrate comprises a first width, and
wherein a second portion of the die substrate comprises a second width that is different from the first width.

5. The package of claim 2, further comprising a second die substrate coupled to the die substrate through an adhesive.

6. The package of claim 1, further comprising a plurality of ball interconnects and a plurality of solder interconnects coupled to the first substrate and the second substrate, wherein the plurality of ball interconnects and the plurality of solder interconnects are located between the first substrate and the second substrate.

7. The package of claim 6, wherein the plurality of ball interconnects include copper core balls (CCBs).

8. The package of claim 1, wherein the cavity has a cavity width that is less than a width of the integrated device.

9. The package of claim 1,
wherein the first substrate comprises:
at least one first dielectric layer; and
a first plurality of interconnects, and
wherein the second substrate comprises:
at least one second dielectric layer; and
a second plurality of interconnects.

10. The package of claim 9, wherein the second plurality of interconnects of the second substrate comprise a plurality of trace interconnects that are located laterally to the integrated device.

11. The package of claim 9, wherein the second plurality of interconnects of the second substrate comprise a plurality of trace interconnects that are (i) located laterally to the integrated device and (ii) vertically overlap with a portion of the integrated device.

12. The package of claim 1, further comprising a second integrated device coupled to the second substrate through at least a plurality of solder interconnects.

13. The package of claim 1, wherein the integrated device is coupled to the first substrate through at least one a plurality of solder interconnects.

14. A method for fabricating a package, comprising:

providing a first substrate;

coupling an integrated device to the first substrate, wherein the integrated device comprises a step back side;

providing a second substrate comprising a cavity, wherein the second substrate is provided such that the integrated device is located at least partially in the cavity of the second substrate; and forming an encapsulation layer that is coupled to the first substrate and the second substrate, wherein the encapsulation layer is located between the first substrate and the second substrate, wherein the encapsulation layer is located at least partially in the cavity of the second substrate, and wherein the second substrate is coupled to the first substrate through a plurality of ball interconnects and a plurality of solder interconnects, and the plurality of ball interconnects and the plurality of solder interconnects are located between the first substrate and the second substrate.

15. The method of claim 14, wherein the integrated device comprises a die substrate that includes a step contour.

16. The method of claim 15, wherein the die substrate comprises a first thickness and a second thickness that is different from the first thickness.

17. The method of claim 15, wherein a first portion of the die substrate comprises a first width, and wherein a second portion of the die substrate comprises a second width that is different from the first width.

18. The method of claim 15, further comprising a second die substrate coupled to the die substrate.

* * * * *